United States Patent
Chen

(10) Patent No.: US 11,514,303 B2
(45) Date of Patent: Nov. 29, 2022

(54) SYNAPTIC RESISTORS FOR CONCURRENT PARALLEL SIGNAL PROCESSING, MEMORY AND LEARNING WITH HIGH SPEED AND ENERGY EFFICIENCY

(71) Applicant: The Regents of the University of California, Oakland, CA (US)

(72) Inventor: Yong Chen, Encino, CA (US)

(73) Assignee: The Regents of the University of California, Oakland, CA (US)

( * ) Notice: Subject to any disclaimer, the term of this patent is extended or adjusted under 35 U.S.C. 154(b) by 152 days.

(21) Appl. No.: 16/961,602

(22) PCT Filed: Jan. 24, 2019

(86) PCT No.: PCT/US2019/015018
§ 371 (c)(1),
(2) Date: Jul. 10, 2020

(87) PCT Pub. No.: WO2019/147859
PCT Pub. Date: Aug. 1, 2019

(65) Prior Publication Data
US 2021/0406660 A1    Dec. 30, 2021

Related U.S. Application Data

(60) Provisional application No. 62/623,586, filed on Jan. 30, 2018, provisional application No. 62/621,320, filed on Jan. 24, 2018.

(51) Int. Cl.
*G06N 3/063* (2006.01)
*G11C 11/54* (2006.01)
*H01L 29/47* (2006.01)

(52) U.S. Cl.
CPC ............ *G06N 3/0635* (2013.01); *G11C 11/54* (2013.01); *H01L 29/47* (2013.01)

(58) Field of Classification Search
None
See application file for complete search history.

(56) References Cited

U.S. PATENT DOCUMENTS 7,412,428 B2 *   8/2008   Nugent .................. B82Y 10/00
                                                          706/26
8,589,320 B2 *  11/2013   Breitwisch ........... G06N 3/0635
                                                          706/15
(Continued)

FOREIGN PATENT DOCUMENTS

KR        20160019682 A      2/2016
KR        20180095977 A      8/2018
(Continued)

OTHER PUBLICATIONS

Tudor, Andrew William, "Synaptic Resistor Networks for Intelligent Systems with Real-Time Learning", 2017 (Year: 2017).*
(Continued)

*Primary Examiner* — Khaja Ahmad
(74) *Attorney, Agent, or Firm* — KPPB LLP

(57) ABSTRACT

Synaptic resistors (synstors), and their method of manufacture and integration into exemplary circuits are provided. Synstors are configured to emulate the analog signal processing, learning, and memory functions of synapses. Circuits incorporating synstors are capable of performing signal processing and learning concurrently in parallel analog mode with speed, energy efficiency, and functions superior to computers.

21 Claims, 21 Drawing Sheets

(56) References Cited

U.S. PATENT DOCUMENTS

Figure 2:
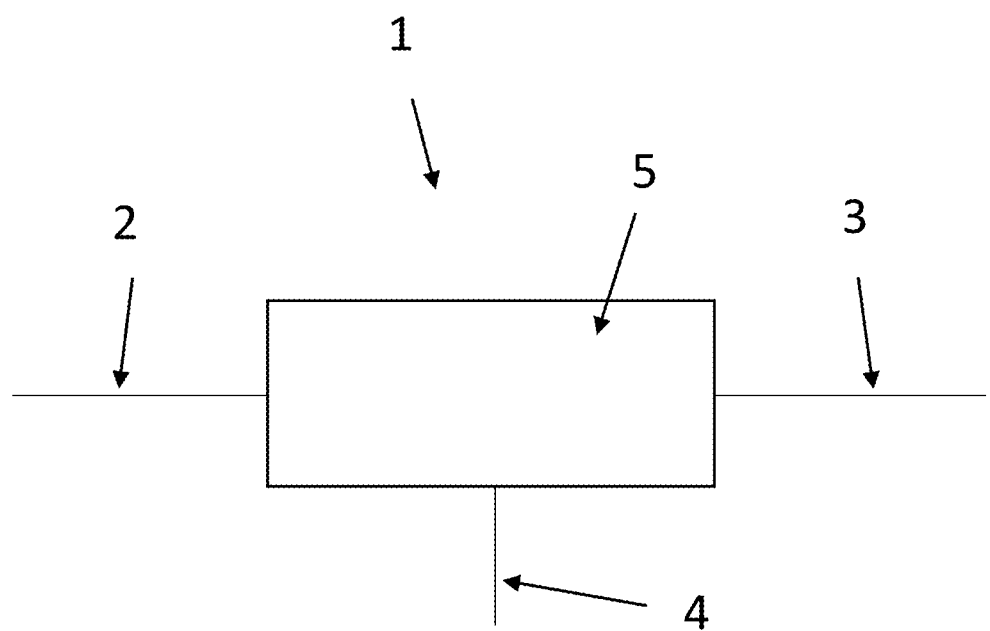

| | | | | |
|---|---|---|---|---|
| 2014/0067743 | A1* | 3/2014 | Park | G06N 3/049 |
| | | | | 706/33 |
| 2015/0348667 | A1* | 12/2015 | Bol | H01L 29/66742 |
| | | | | 977/750 |
| 2018/0012123 | A1* | 1/2018 | Han | G06N 3/049 |
| 2019/0065929 | A1* | 2/2019 | Koelmans | G06N 3/04 |
| 2020/0227635 | A1* | 7/2020 | Yang | H01L 45/146 |

FOREIGN PATENT DOCUMENTS

| | | |
|---|---|---|
| KR | 20180115995 A | 10/2018 |
| WO | 2016069334 A1 | 5/2016 |
| WO | 2019147859 A2 | 8/2019 |
| WO | 2019147859 A3 | 9/2019 |
| WO | 2019147859 A9 | 3/2022 |

OTHER PUBLICATIONS

"Parker-A-biomimetic-fabricated-carbon-nanotube-synapse-for-prosthetic-applications", 2011 (Year: 2011).*

"Analog Neuromorphic Module Based on Carbon Nanotube Synapses" (Year: 2013).*

International Preliminary Report on Patentability for International Application No. PCT/US2019/015018, Report dated Jul. 28, 2020, dated Aug. 6, 2020, 6 pgs.

International Search Report and Written Opinion for International Application No. PCT/US2019/015018, Search completed Jun. 6, 2019, dated Jul. 15, 2019, 10 pgs.

Backus, "Can Programming Be Liberated from Von Neumann Style—Functional Style and Its Algebra of Programs", Communications of the ACM, Aug. 1978, vol. 21, No. 8, pp. 613-641, doi: 10.1145/359576.359579.

Benjamin et al., "Neurogrid: A Mixed-Analog-Digital Multichip System for Large-Scale Neural Simulations", Proceedings of the IEEE, May 2014, vol. 102, No. 5, pp. 699-716, doi: 10.1109/JPROC.2014.2313565.

Brooks et al., "Is the brain a good model for machine intelligence?", Nature, Feb. 23, 2012, vol. 482, pp. 462-463, doi: 10.1038/482462a.

Chen et al., "Correlative Learning: A Basis for Brain and Adaptive Systems", (Wiley, 2007), pp. 1-476, doi:10.1002/9780470171455 (presented in two parts).

Chen et al., "The Role of Metal-Nanotube Contact in the Performance of Carbon Nanotube Field-Effect Transistors", Nano Letters, Jun. 24, 2005, vol. 5 , No. 7, pp. 1497-1502, doi: 10.1021/nl0508624.

Diorio et al., "A single-transistor silicon synapse", IEEE Transactions on Electron Devices, Nov. 1996, vol. 43, No. 11, pp. 1972-1980, doi: 10.1109/16.543035.

Eryilmaz et al., "Brain-like associative learning using a nanoscale non-volatile phase change synaptic device array", Frontiers in Neuroscience, Jul. 22, 2014, vol. 8, Article 205, pp. 1-11, doi: 10.3389/fnins.2014.00205.

Feynman, "Simulating Physics with Computers", International Journal of Theoretical Physics, Jun. 1982, vol. 21, No. 6-7, pp. 467-488, doi: 10.1007/BF02650179.

Guez et al., "On the Stability, Storage Capacity, and Design of Nonlinear Continuous Neural Networks", IEEE Transactions on Systems Man and Cybernetics, Feb. 1988, vol. 18, No. 1, pp. 80-87, doi: 10.1109/21.87056.

Hebb, "The organization of behavior; a neuropsychological theory", (Wiley, 1949), 365 pgs.

Hodgkin et al., "A Quantitative Description of Membrane Current and Its Application to Conduction and Excitation in Nerve", Journal of Physiology, Aug. 28, 1952, vol. 117, No. 4, pp. 500-544.

Hopfield et al., "Neural Networks and Physical Systems with Emergent Collective Computational Abilities", Proceedings of the National Academy of Sciences USA, Jan. 15, 1982, vol. 79, No. 8, pp. 2554-2558, doi: 10.1073/pnas.79.8.2554.

Jo et al., "Nanoscale Memristor Device as Synapse in Neuromorphic Systems", Nano Letters, Mar. 1, 2010, vol. 10, No. 4, pp. 1297-1301, doi: 10.1021/nl904092h.

Kim et al., "Synaptic organic transistors with a vacuum-deposited charge-trapping nanosheet", Scientific Reports, Sep. 20, 2016, 6:33355.

Kumar et al., "Chaotic dynamics in nanoscale $NbO_2$ Mott memristors for analogue computing", Nature, Aug. 17, 2017, vol. 548, pp. 318-321, doi: 10.1038/nature23307.

Lai et al., "Ionic/Electronic Hybrid Materials Integrated in a Synaptic Transistor with Signal Processing and Learning Functions.", Advanced Materials, Jun. 2, 2010, vol. 22, pp. 2448-2453, doi: 10.1002/adma.201000282.

Lee et al., "Electronic-band-structure mapping of nanotube transistors by scanning photocurrent microscopy", Small, Dec. 4, 2007, vol. 3, No. 12, pp. 2038-2042, doi: 10.1002/smll.200700418.

Merolla et al., "A million spiking-neuron integrated circuit with a scalable communication network and interface", Science, Aug. 8, 2014, vol. 345, No. 6197, pp. 668-673, doi: 10.1126/science.1254642.

Prezioso et al., "Training andoperation of an integrated neuromorphic network based on metal-oxide memristors", Nature, May 7, 2015, vol. 521, pp. 61-64, doi: 10.1038/nature14441.

Rinkio et al., "High-yield of memory elements from carbon nanotube field-effect transistors with atomic layer deposited gate dielectric", New Journal of Physics, Oct. 16, 2008, vol. 10, 103019, 16 pgs., doi:10.188/1367-2630/10/10/103019.

Sahidullah et al., "Design, analysis and experimental evaluation of block based transformation in MFCC computation for speaker recognition", Speech Communication, May 2012, vol. 54, No. 4, pp. 543-565, doi: 10.1016/j.specom.2011.11.004.

Silver et al., "Mastering the game of Go with deep neural networks and tree search", Nature, Jan. 28, 2016, vol. 529, pp. 484-489, doi: 10.1038/nature16961.

Turing, "Computing machinery and intelligence", Mind, Oct. 1, 1950, vol. 49, No. 28, pp. 433-460.

Waldrop, "The semiconductor industry will soon abandon its pursuit of Moore's law. Now things could get a lot more interesting", Nature, Feb. 9, 2016, vol. 530, No. 7589, pp. 144-147, doi: 10.1038/530144a.

Wang et al., "A2-transistor/1-resistor artificial synapse capable of communication and stochastic learning in neuromorphic systems", Frontiers in Neuroscience, Jan. 15, 2015, vol. 8, Article 438, p. 1-11, doi:10.3389/fnins.2014.00438.

Yu et al., "Scaling-up Resistive Synaptic Arrays for Neuro-inspired Architecture Challenges and Prospect", IEEE, 2015, 4 pgs.

Zeki, "A massively asynchronous, parallel brain", Philosophical Transactions B, Royal Society, May 19, 2015, vol. 370, No. 1668, pp. 1-14, doi: 10.1098/rstb.2014.0174.

Extended European Search Report for European Application No. 19743913.6, Search completed Sep. 17, 2021, dated Sep. 28, 2021, 12 Pgs.

Tudor, Synaptic Resistor Networks for Intelligent Systems with Real-Time Learning, UCLA Electronic Theses and Dissertations, Jan. 1, 2017, pp. 88.

* cited by examiner

FIG. 1A

Input
↓
Memory
↓
Learning
↓
Memory
↓
Processing
↓ t
Output (Prior Art)

FIG. 1B

Inputs
↓ ↓ ↓
Memory
Processing
Learning
↓ ↓ ↓
Outputs

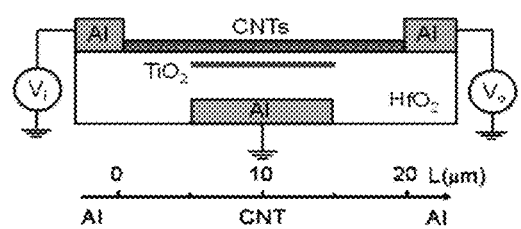
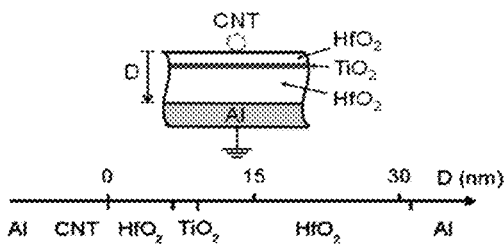
FIG. 9A
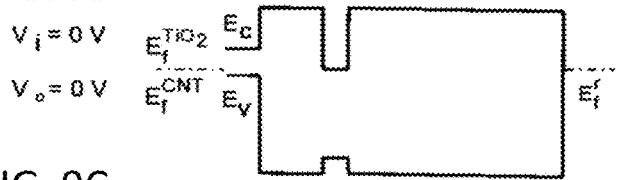
FIG. 9B
$V_i = 0$ V
$V_o = 0$ V
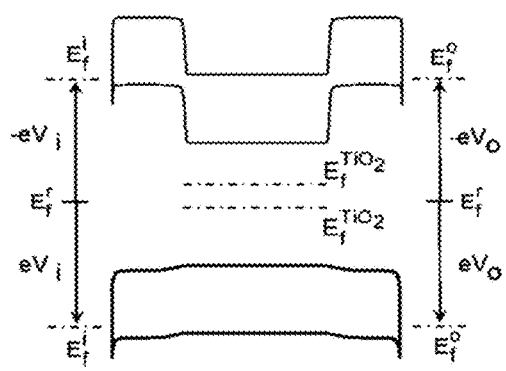
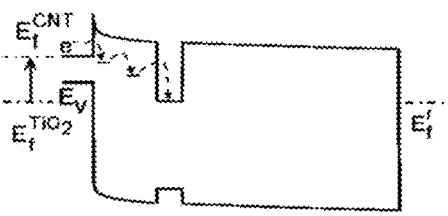
FIG. 9C
$V_i = -1.75$ V
$V_o = -1.75$ V
FIG. 9D
$V_i = 1.75$ V
$V_o = 1.75$ V
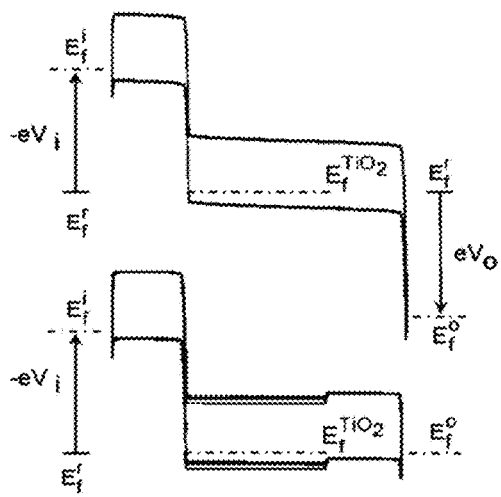
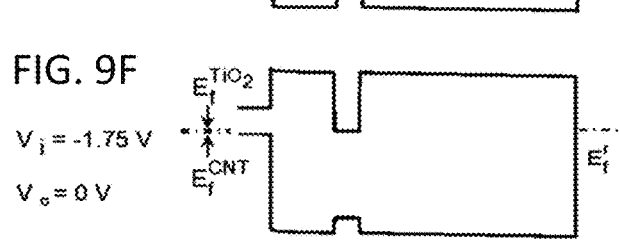
FIG. 9E
$V_i = -1.75$ V
$V_o = 1.75$ V
FIG. 9F
$V_i = -1.75$ V
$V_o = 0$ V
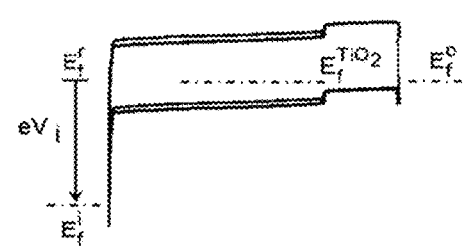
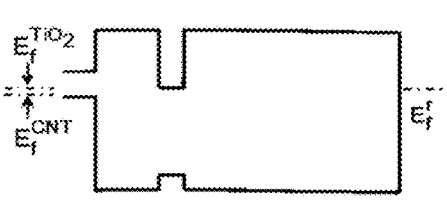
FIG. 9G
$V_i = 1.75$ V
$V_o = 0$ V

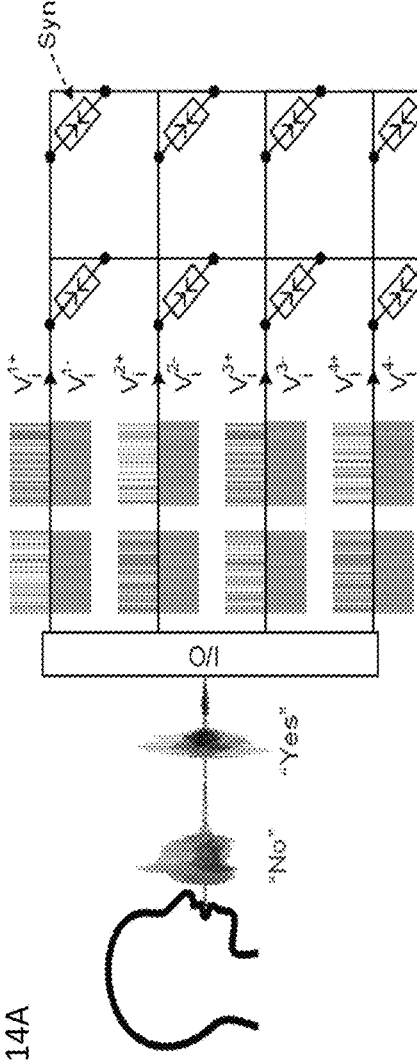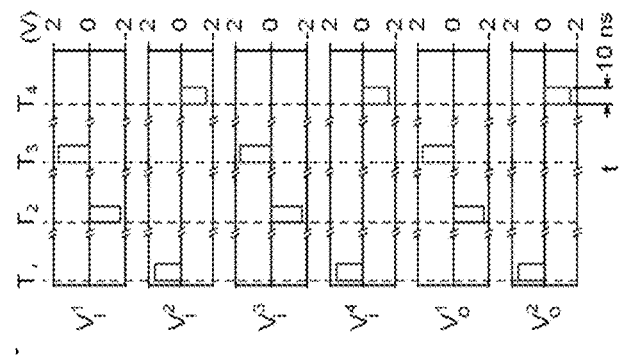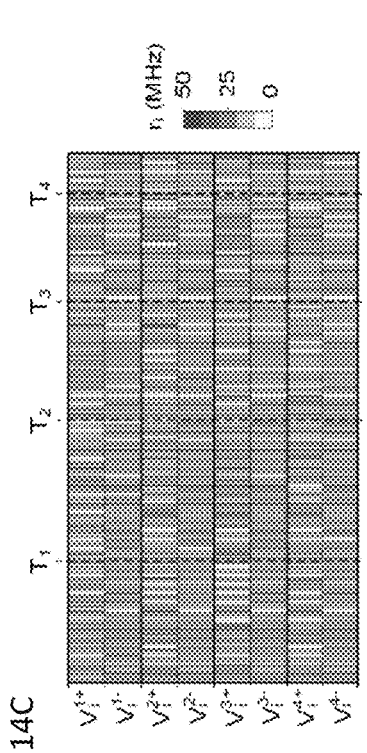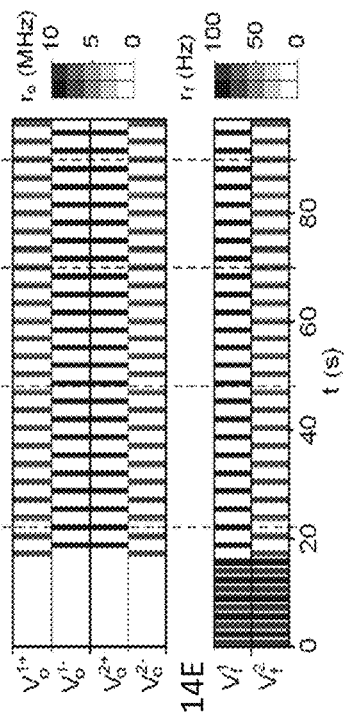
FIG. 14A  FIG. 14B  FIG. 14C  FIG. 14D  FIG. 14E  FIG. 14F

SYNAPTIC RESISTORS FOR CONCURRENT PARALLEL SIGNAL PROCESSING, MEMORY AND LEARNING WITH HIGH SPEED AND ENERGY EFFICIENCY

CROSS REFERENCE TO RELATED APPLICATIONS

This application is a national stage of PCT Patent Application No. PCT/US2019/015018, entitled "Synaptic Resistors for Concurrent Parallel Signal Processing, Memory and Learning with High Speed and Energy Efficiency" to Chen, filed Jan. 24, 2019, which claims priority to U.S. Provisional Application No. 62/621,320, entitled "Synaptic Resistors and Circuits With Signal Processing, Memory, and Learning Functions" to Chen et al., filed Jan. 24, 2018, and claims priority to U.S. Provisional Application No. 62/623,586, entitled "Synaptic Resistors and Circuits With Signal Processing, Memory, and Learning Functions" to Chen et al., filed Jan. 30, 2018, the disclosures of which are incorporated by reference herein in their entirety.

STATEMENT REGARDING FEDERALLY SPONSORED RESEARCH

This invention was made with government support under Grant Number FA9550-15-1-0056, awarded by the U.S. Air Force, Office of Scientific Research. The government has certain rights in the invention.

FIELD OF THE INVENTION

This disclosure describes an electronic device that facilitates concurrent parallel signal processing and learning in its circuit with high speed and energy efficiency, and more particularly to a synaptic resistor (hereafter also referred as "synstor") that can emulate the synapse with signal processing, learning, and memory functions in a single device.

BACKGROUND OF THE INVENTION

Over decades, modern electronics has evolved through a series of major developments (e.g., transistors, integrated circuits, memories, microprocessors) leading to the programmable electronic circuits that are ubiquitous today. The computing and learning processes in transistor-based computers and neuromorphic circuits are implemented sequentially on logic and memory transistors based on the Turing model. Signals are processed by logic transistors with their states programmed sequentially by the signals from memory transistors, and the program stored in the memory is sequentially modified in turn by the signals from logic transistors for learning.

Neuromorphic devices such as synaptic transistor, phase change memory (PCM), and memory resistors (memristors) have been developed to emulate the synapses to process signals in parallel mode. (See, e.g., WO2016/069334, the disclosure of which is incorporated herein by reference.) Correlative learning algorithms such as spiking-time-dependent plasticity (STDP) are executed on individual devices by applying voltage signals on the devices. However, the writing voltage signals for learning (whereas device conductance changes) have different magnitudes, polarities, and/or dynamic profiles from the reading voltage signals for signal processing (whereas device conductance does not change). To avoid the interference between the voltage signals for processing and learning, when the signal processing is executed in the circuits, the learning is interrupted; when the learning is executed in the circuits, the signal processing algorithm is interrupted. The learning and processing cannot be executed concurrently. Moreover, the modification of the device conductance in the learning process is not only determined by the voltage signals applied on the device, but also by other factors, such as the current flowing through the device, which prevent the device conductance to be modified accurately. In order to modify device conductances accurately in a circuit, learning algorithms are executed in external digital computing circuits to obtain targeted conductances, then devices are modified to the targeted conductances by applying different writing voltages on different devices sequentially in iterative writing and reading processes. The devices still need to be modified in serial learning processes by the signals from peripheral memory, signal processing, and/or control circuits. Accordingly, an electronic device that can emulate a synapse to facilitate the concurrent parallel signal processing and learning in the brain has not been realized,

SUMMARY OF THE DISCLOSURE

Many embodiments of the disclosure are directed to electronic devices that facilitate concurrent parallel signal processing and learning in their circuits with high speed and energy efficiency.

Many other embodiments of the disclosure are directed to a synstor that can emulate the synapse with analog signal processing, learning, and memory functions in a single device.

Still many other embodiments of the disclosure are directed to a synstor circuit that can emulate the brain to create circuits with concurrent parallel signal processing and learning capabilities with speed, power efficiency, and learning capabilities significantly superior to computers.

Some embodiments of the disclosure are directed to a synstor, capable of providing analog signal processing, memory and learning functions of synapse, including:
- an input electrode and an output electrode;
- a semiconducting channel connected between the input and output electrodes;
- a dielectric layer disposed adjacent to the semiconducting channel, the dielectric layer disposed adjacent to the single side of the channel or the multiple sides of the channel;
- a reference electrode disposed adjacent to the dielectric layer;
- a charge storage material disposed within a portion of the dielectric layer;
- wherein at least a portion of the dielectric layer is disposed between the charge storage material and the semiconducting channel such that a voltage difference between the channel and the charge storage material must have a magnitude above a threshold value to drive charge through the dielectric layer to the charge storage material to alter a net charge within the charge storage material in an analog mode;
- wherein the combination of the input and output electrodes and the semiconducting channel between form resistors, and the combination of the semiconducting channel, dielectric layer, charge storage material, and reference electrode form capacitors;
- wherein the synstor is configured to apply a zero or a constant voltage to the reference electrode, and when no voltage signals are applied on the input and output electrodes, a standby zero voltage or a standby constant voltage is applied on the input and output electrodes; and wherein the synstor is further configured such that sets of voltage signals may be applied on the input and output electrodes with respect to the standby voltage such that:

when a set of input voltage signals is applied on the input electrode and wherein no voltage signal is applied on the output electrode, the set of input voltage signals induce an output current on the output electrode through the resistors and charges the capacitors such that, after the set of input voltage signals end, the charge in the capacitors is discharged and induces an output current on the output electrode, and wherein the output current may last after the set of input voltage signals ends, when a set of voltage signals is applied on the input electrode and wherein a set of voltage signals with the same or similar amplitudes as the set of the input voltage signals is applied to the output electrode simultaneously, the magnitude of the voltage difference between the channel and the charge storage material produced thereby is above the threshold value, charge is driven through the portion of the dielectric layer disposed between the channel and the charge storage material to modify the net charge within the charge storage material and the conductance of the synstor in an analog mode for learning, when a set of voltage signals is applied to one of either the input or the output electrode and wherein no voltage signal or a set of voltage signals with the opposite polarity is applied to the other of either the input or output electrode simultaneously, or when no voltage signals is applied to either the input or the output electrode, the magnitude of the voltage difference between the channel and the charge storage material produced thereby falls below the threshold value such that charge is not driven through the portion of the dielectric layer disposed between the channel and the charge storage material such that the net charge in the charge storage material remains unchanged and the conductance of the synstor remains unchanged for learning, and when a set of voltage signals is applied to one of either the input or the output electrode with respect to the standby voltage and wherein no voltage signal or a set of voltage signals with the opposite polarity is applied to the other of either the input or output electrode simultaneously, or when no voltage signals is applied to either the input or the output electrode, or when no external voltages is applied to either the input or the output or the reference electrode, for the same reason, the conductance of the synstor remains unchanged as memory.

In still some embodiments, the voltage signals applied to the input and output electrodes can be voltage pulses with fixed amplitudes and temporal durations for signal processing and learning.

In yet some embodiments, the set of the input voltage signals induces a dynamic output current for signal processing, and the dynamic output current is the convolution of a kernel function and the product of the set of input voltage signals and the synstor conductance.

In still yet some embodiments, the change rate of the conductance of the synstor is equal to the product of the conductance modification coefficient, the input voltage signal, and the output voltage signal.

In still yet some embodiments, the input and output electrodes and the semiconducting channel form a contact with a contact resistance, which is comparable with or larger than the resistance of the channel.

In still yet some embodiments, wherein the semiconducting channel forms Schottky barriers with the input and output electrodes, and wherein the input and output electrodes and the channel form a contact with a contact resistance which is comparable with or larger than the resistance of the channel.

In still yet some embodiments, the channel is dimensioned to have a length between the input and output electrodes longer than the length of the reference electrode.

In still yet some embodiments, the reference electrode extends beyond the edges of the portion of the dielectric layer containing the charge storage material.

In still yet some embodiments, the thickness of the dielectric layer between the charge storage material and the channel is less than the thickness of the dielectric layer between the charge storage material and the reference electrode.

In still yet some embodiments, the semiconducting channel comprises a semiconducting material selected from the group consisting of carbon nanotube, Si, graphene, Ge, SiC, ZnO, InO, InP, $TiO_2$, $Cu_2O$, GaN, GaAs, $MoS_2$, $MoSe_2$, $WS_2$, $WSe_2$, GaSe, GaTe, FeTe, polymers, molecules, and combinations thereof.

In still yet some embodiments, the semiconducting channel has a channel length between about $5\text{-}10^6$ nm, a channel width between about $5\text{-}10^6$ nm, and a channel thickness between about $0.1\text{-}10^5$ nm.

In still yet some embodiments, the input, output and reference electrodes comprise a conducting or semiconducting material selected from the group consisting of Ti, Al, Au, Ni, Pt, Cu, carbon nanotube, Si, graphene, Ge, SiC, ZnO, InO, InP, $TiO_2$, $Cu_2O$, GaN, GaAs, $MoS_2$, $MoSe_2$, $WS_2$, $WSe_2$, GaSe, GaTe, FeTe, polymers, and combinations thereof.

In still yet some embodiments, the dielectric layers comprises an insulative material selected from the group consisting of $HfO_2$, $Al_2O_3$, $SiO_2$, $Si_3N_4$, Si, C, Ge, SiC, ZnO, InO, InP, $TiO_2$, $Cu_2O$, GaN, GaAs, polymers, molecules, and combinations thereof.

In still yet some embodiments, the dielectric layers have a dielectric length between about $5\text{-}10^6$ nm, a dielectric width between about $5\text{-}10^6$ nm, and a dielectric thickness between about $0.2\text{-}10^3$ nm.

In still yet some embodiments, the charge storage material is selected from the group consisting of molecules, nanoparticles, semiconductor quantum dots, dopants, implanted ions, defects, vacancies, impurities, semiconducting materials, dielectric materials, and metals.

In still yet some embodiments, the charge storage material is within a volume with a length between about $5\text{-}10^6$ nm, a width between about $5\text{-}10^6$ nm, and a thickness between about $0.1\text{-}10^3$ nm.

In still yet some embodiments, the semiconducting channel extends laterally beyond the edges of the portion of the first dielectric layer containing the charge storage material; the semiconducting channel extends laterally beyond the edges of the reference electrode; and the reference electrode extends laterally beyond the edges of the portion of the first dielectric layer containing the charge storage material; and the thickness of the dielectric layer between the charge storage material and the channel is less than the thickness of the dielectric layer between the charge storage material and the reference electrode.

Various embodiments of the disclosure are directed to a synstor capable of providing analog signal processing, memory and learning functions of biological synapse, including:

a body connected with an input electrode, an output electrode, and a reference electrode;

wherein the synstor is configured to apply a zero or a constant voltage to the reference electrode, and when no sets of voltage signals are applied on the input and output electrodes, a standby zero voltage or a standby constant voltage is applied on the input and output electrodes; and wherein the synstor is further configured such that when sets of voltage signals are applied on the input and output electrodes with respect to the standby voltage:

when a set of input voltage signals is applied on the input electrode with respect to the standby voltage and wherein no voltage signal is applied on the output electrode, the set of the input voltage signals induces a dynamic output current on the output electrode for signal processing, when a set of voltage signals is applied on the input electrode and wherein a set of voltage signals with the same or similar amplitudes as the set of the input voltage signals is applied to the output electrode simultaneously, the conductance of the synstor is changed in analog mode; when a set of voltage signals is applied to one of either the input or the output electrode and wherein no voltage signal or a set of voltage signals with the opposite polarity is applied to the other of either the input or output electrode simultaneously, or when no voltage signals is applied to either the input or the output electrode, the conductance of the synstor remains unchanged for learning, and when a set of voltage signals is applied to one of either the input or the output electrode with respect to the standby voltage and wherein no voltage signal or a set of voltage signals with the opposite polarity is applied to the other of either the input or output electrode simultaneously, or when no voltage signals is applied to either the input or the output electrode, or when no external voltages is applied to either the input or the output or the reference electrode, the conductance of the synstor remains unchanged as memory.

In still various embodiments, the dynamic output current is a convolution of a kernel function and the product of the input voltage signals and the synstor conductance.

In yet various embodiments, the change rate of the conductance of the synstor is the product of the conductance modification coefficient, the input voltage signal, and the output voltage signal.

Many embodiments of the disclosure are directed to a synaptic circuit capable of providing analog signal processing, memory and learning functions including:

a plurality of synstors, each in turn comprising a body connected with an input electrode, an output electrode, and a reference electrode;

wherein each synstor is configured to apply a zero or a constant voltage to the reference electrode, and when no sets of voltage signals are applied on the input and output electrodes, a standby zero voltage or a standby constant voltage is applied on the input and output electrodes; and wherein each synstor is configured such that sets of voltage signals are applied on the input and output electrodes with respect to the standby voltage, thereof such that:

when a set of input voltage signals is applied on the input electrode with respect to the standby voltage and wherein no voltage signal is applied on the output electrode, the set of the input voltage signals induces a dynamic output current on the output electrode for signal processing, when a set of voltage signals is applied on the input electrode and wherein a set of voltage signals with the same or similar amplitudes as the set of the input voltage signals is applied to the output electrode simultaneously, the conductance of the synstor is changed in analog mode; when a set of voltage signals is applied to one of either the input or the output electrode and wherein no voltage signal or a set of voltage signals with the opposite polarity is applied to the other of either the input or output electrode simultaneously, or when no voltage signals is applied to either the input or the output electrode, the conductance of the synstor remains unchanged for learning, and when a set of voltage signals is applied to one of either the input or the output electrode with respect to the standby voltage and wherein no voltage signal or a set of voltage signals with the opposite polarity is applied to the other of either the input or output electrode simultaneously, or when no voltage signals is applied to either the input or the output electrode, or when no external voltages is applied to either the input or the output or the reference electrode, the conductance of the synstor remains unchanged as memory; and wherein each of the plurality of synstors is a component of a circuit comprising an M×N network of said synstors connected with M input electrodes and N output electrodes such that each input electrode is connected with multiple output electrodes by one or more synstors such that a set of voltage signals applied on the M input electrodes induces output currents via synstors flowing to the N output electrodes in analog parallel mode for signal processing;

wherein the dynamic output currents on the N output electrodes define a current vector which is equal to the convolution of kernel functions and the product of the synstor conductance matrix and the vector of the input voltage signals on the M input electrodes;

when a set of voltage signals is applied on the M input electrodes and a set of voltage signals is applied on the N output electrodes, concurrently the synstor conductance matrix is modified in an analog parallel mode for learning;

wherein the modification rate of the synstor conductance matrix is proportional to the outer product between the vectors of input and output voltage signals; and wherein concurrently, the circuit is configured to process the voltage signals on the input electrodes and is modified by the voltage signals on the input and output electrodes.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which forms a part of this disclosure.

BRIEF DESCRIPTION OF THE SEVERAL VIEWS OF THE DRAWING(S)

These and other features and advantages of the present invention will be better understood by reference to the following detailed description when considered in conjunction with the accompanying data and figures, wherein:

FIG. 1A provides a schematic of the operation of a conventional computer based on the Turing Model according to the prior art.

FIG. 1B provides a schematic of the operations of a neural circuit in the brain and a circuit incorporating synstors according to embodiments of this disclosure.

FIG. 2 provides a schematic diagram of basic elements in a synstor of this disclosure.

Figure 3A:
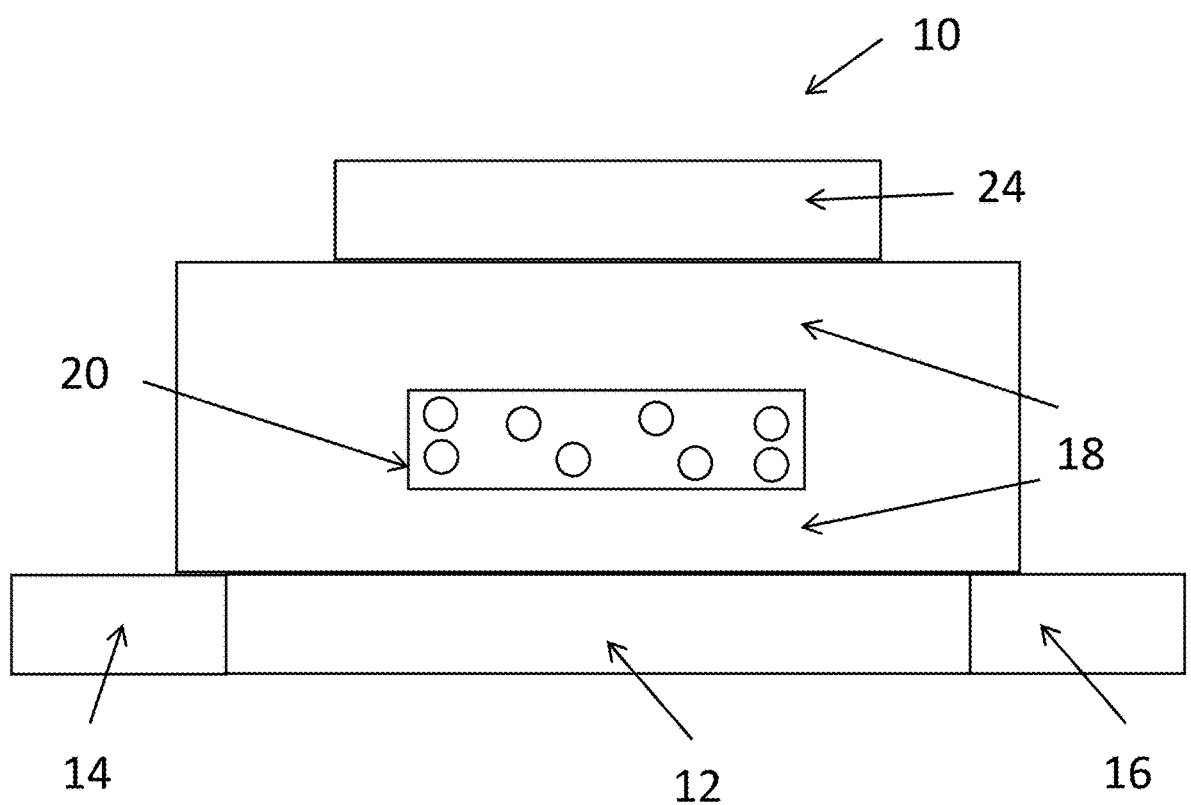

FIG. 3A provides a schematic diagram of a synstor structure with reference electrode and charge storage materials on one side of the channel according to embodiments of this disclosure.

Figure 3B:
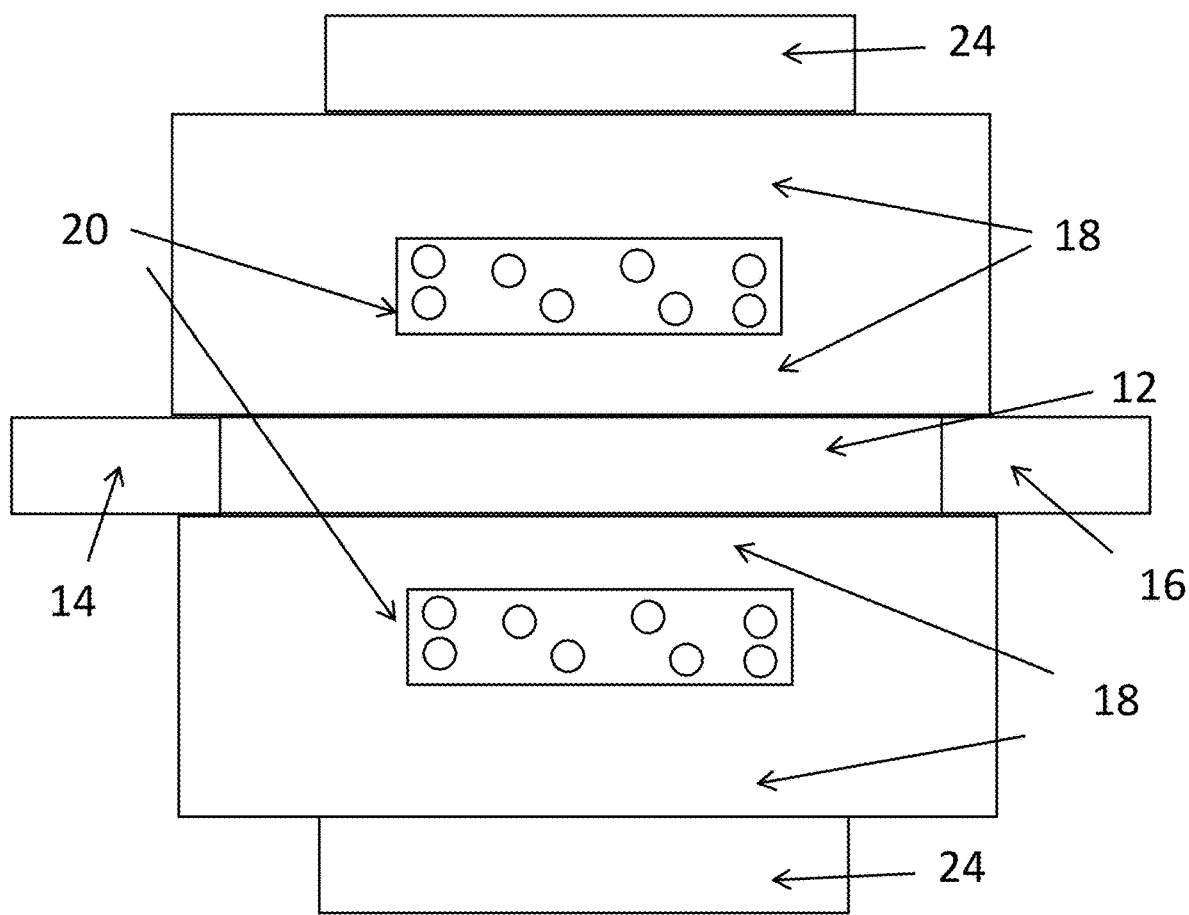

FIG. 3B provides a schematic diagram of a different synstor structure with reference electrode and charge storage materials on multiple sides of the channel according to embodiments of this disclosure.

Figure 4A:
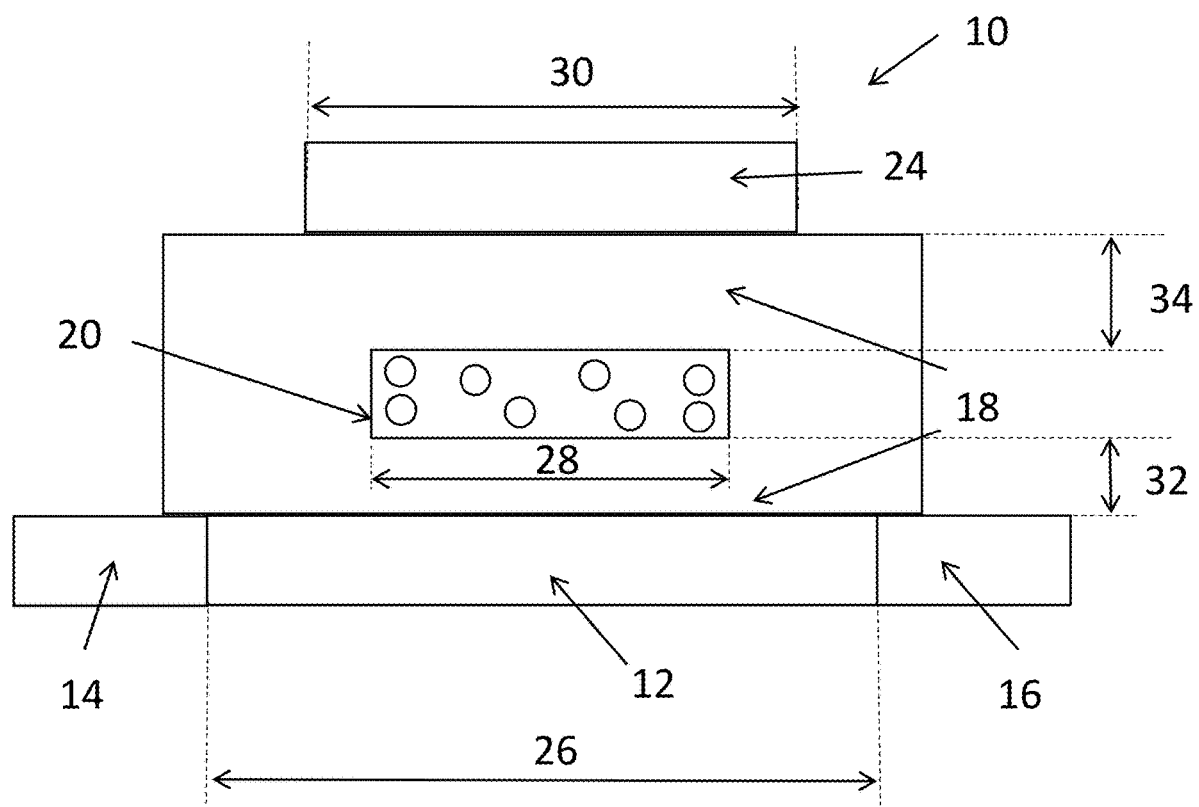
Figure 4B:
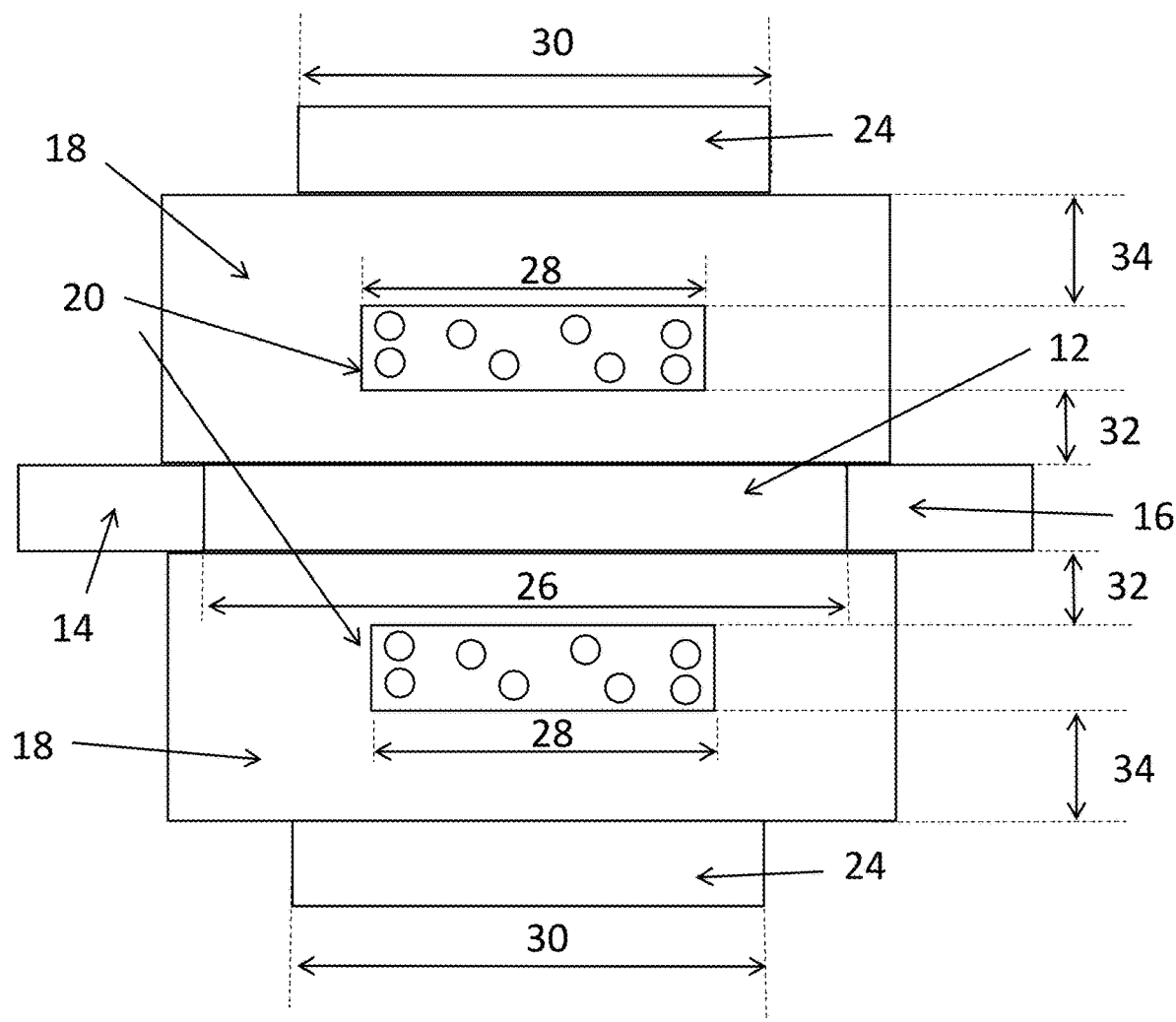

FIGS. 4A and 4B provide schematic diagrams of synstor structures with critical dimensions according to embodiments of this disclosure.

Figure 5:
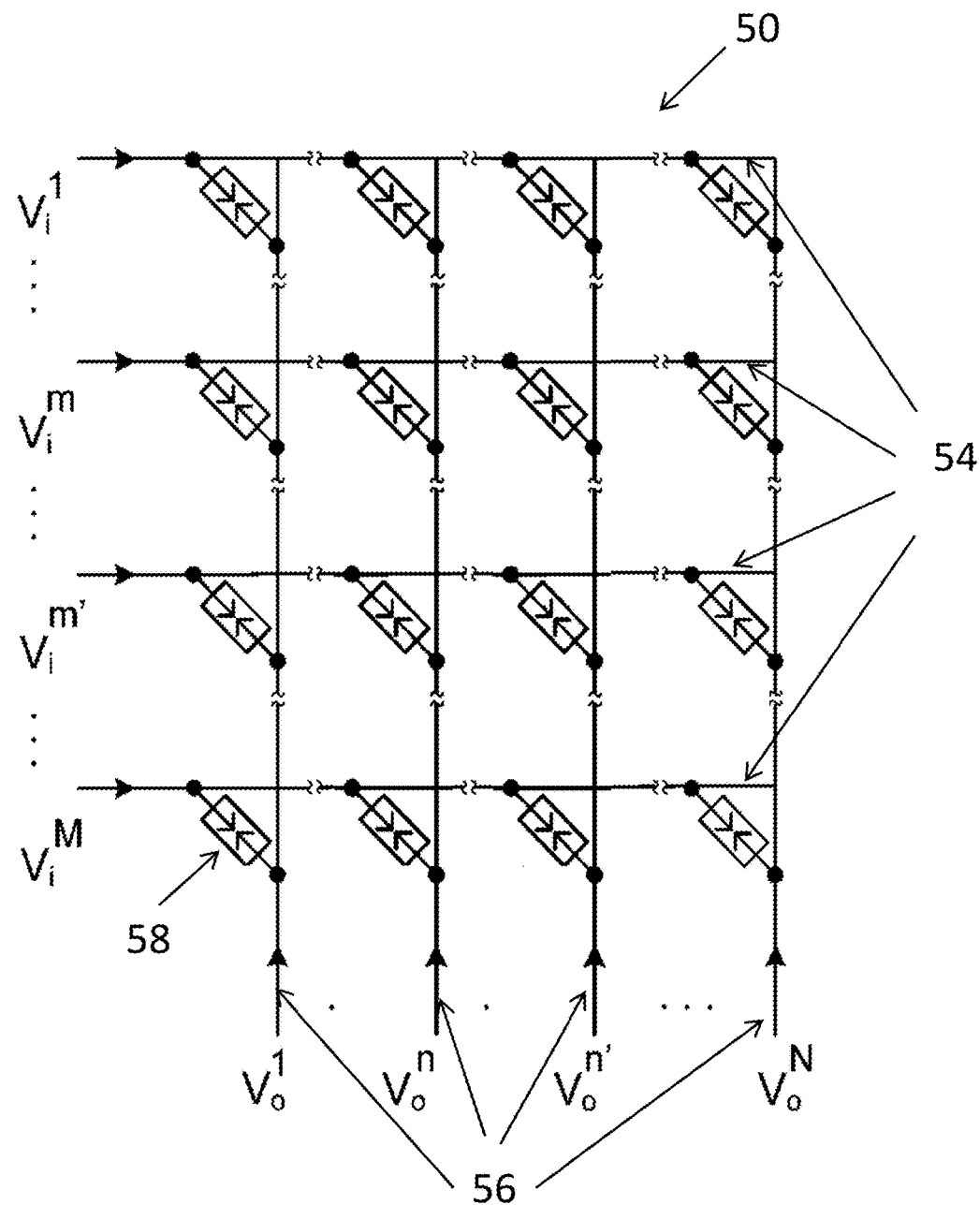

FIG. 5 provides a schematic of an M×N circuit of synstors connected with M rows of input electrodes and N columns of output electrodes according to embodiments of this disclosure, where $V_i^m$ denotes the amplitude of a voltage signal on the $m^{th}$ input electrode, and $V_o^n$ denotes the amplitude of a voltage signal on the $n^{th}$ output electrode.

Figure 6:
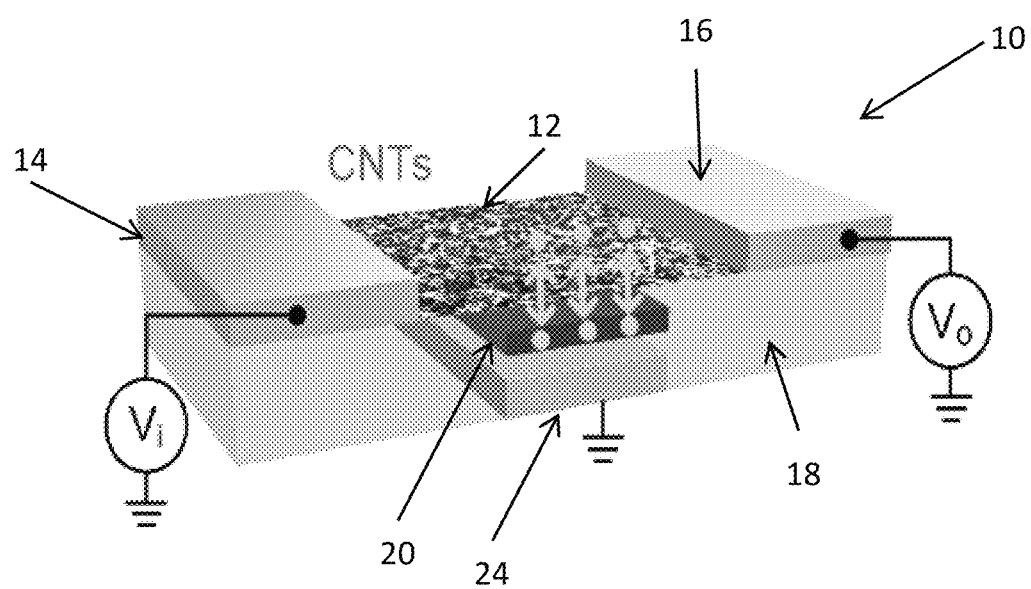

FIG. 6 provides a 3D schematic illustration of the structure of a synstor with a carbon nanotube (CNT) channel according to embodiments of the disclosure.

Figure 7:
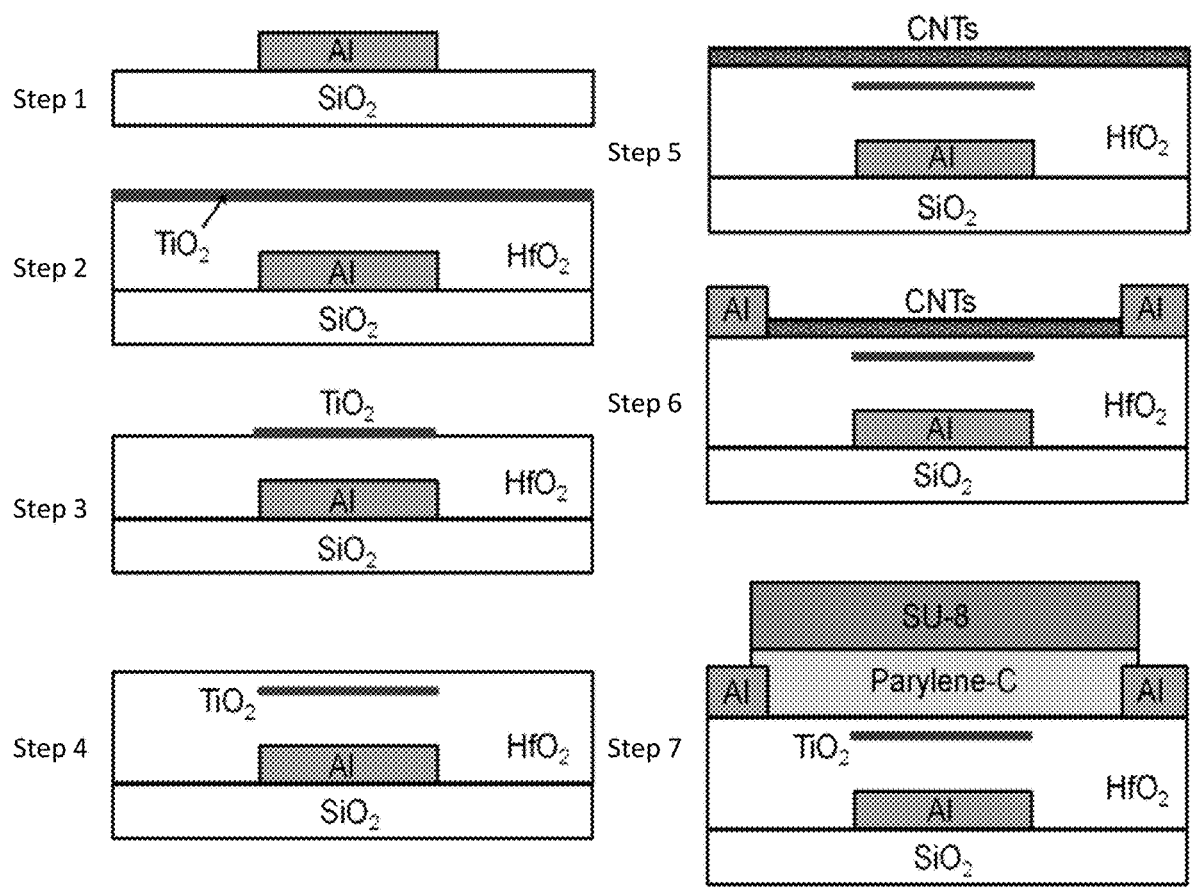

FIG. 7 provides a schematic of a method of fabricating a CNT synstor according to embodiments of this disclosure.

Figure 8A:
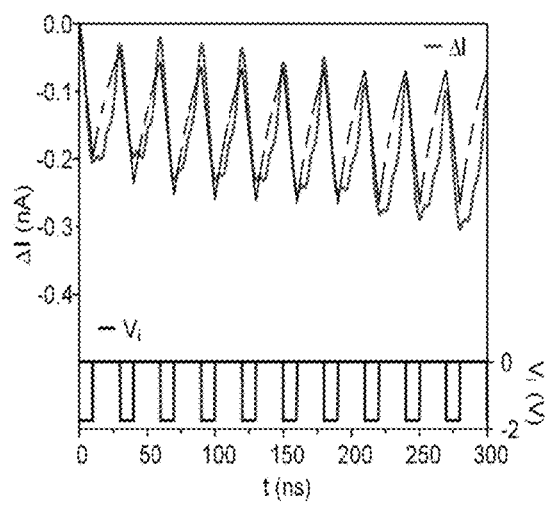
Figure 8B:
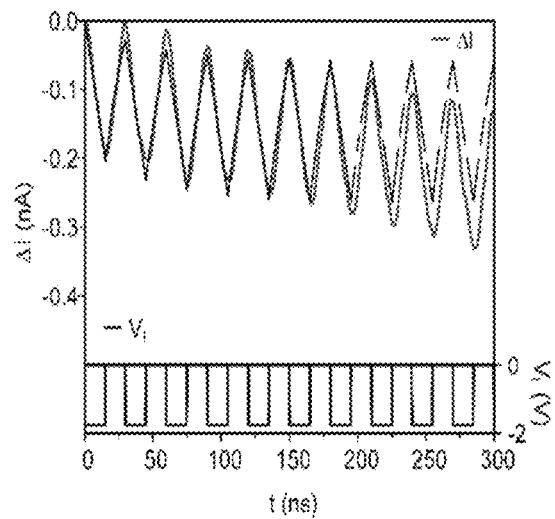

FIGS. 8A to 8B show that a series of voltage pulses (bottom solid lines) with an amplitude $V_i=-1.75$ V with a pulse width of (A) 10 ns and (B) 15 ns were applied on the input electrode of a CNT synstor, and induced the change of currents, $\Delta I(t)$, on the output electrode of the CNT synstor. The experimentally measured currents, $\Delta I(t)$, (top solid lines) are fitted by theoretical model (top dashed lines).

FIG. 9A provides schematics showing a CNT-based synstor structure according to embodiments of the disclosure, where: (Left) is a scheme showing the cross-sectional structure of a CNT-based synstor structure according to embodiments of the disclosure composed of a $TiO_2$ charge storage layer embedded in a $HfO_2$ dielectric layer, an electrically grounded Al reference electrode, and a semiconducting CNT network channel connected with an Al input electrode and an Al output electrode, and (Right) is a scheme showing a cross-sectional structure of a synstor along a CNT.

FIGS. 9B to 9G show electronic energy-band structures (Left) along the Al input electrode, the CNT channel, and the Al output electrode, and (Right) along CNT channel, the $HfO_2$ dielectric layer, the $TiO_2$ charge storage layer, the $HfO_2$ dielectric layer, and the Al reference electrode under conditions where: (B) shows $V_i=V_o=0$, (C) shows $V_i=V_o=-1.75$ V, (D) shows $V_i=V_o=1.75$ V, (E) shows $V_i=-1.75$ V and $V_o=1.75$ V, (F) shows $V_i=-1.75$ V and $V_o=0$, and (G) shows $V_i=1.75$ V and $V_o=0$ (note: CNT energy-band diagrams with no charge (middle lines), negative charge (top lines), and positive charge (bottom lines) stored in the $TiO_2$ layer are also shown in FIGS. 9F and 9G). $E_f^i$, $E_f^o$, $E_f^r$, and $E_f^{TiO_2}$ denote the Fermi energies of the Al input, output, reference electrodes, and $TiO_2$ charge storage layer, respectively, the electronic charge is represented by "e", $E_c$ and $E_v$ denote the edges of the CNT conduction and valence bands, respectively, electrons injected into or depleted from the $TiO_2$ layer are illustrated as the filled green circles, holes in CNTs, $TiO_2$, or transported laterally along CNTs are illustrated as the open blue circles, the purple dot-dashed lines represent the Fermi energy of the $TiO_2$ charge storage layer, and the black dot-dashed lines represent the Fermi energies of the CNT network and the Al input and output electrodes).

Figure 10A:
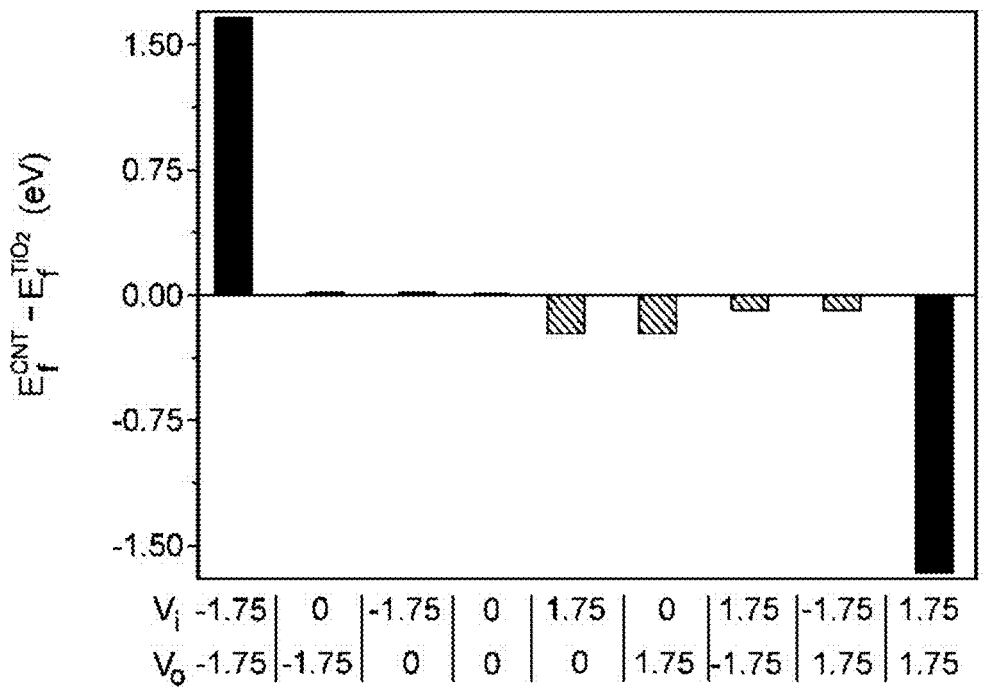

FIG. 10A provides a simulated data plot of the differences between the average Fermi energies of the CNT channel, $E_f^{CNT}$, and the $TiO_2$ charge storage layer, $E_f^{TiO_2}$, in a CNT synstor according to embodiments of the disclosure under various combinations of $V_i$ voltage signals on its input electrode and $V_o$ voltage signals on its output electrode.

Figure 10B:
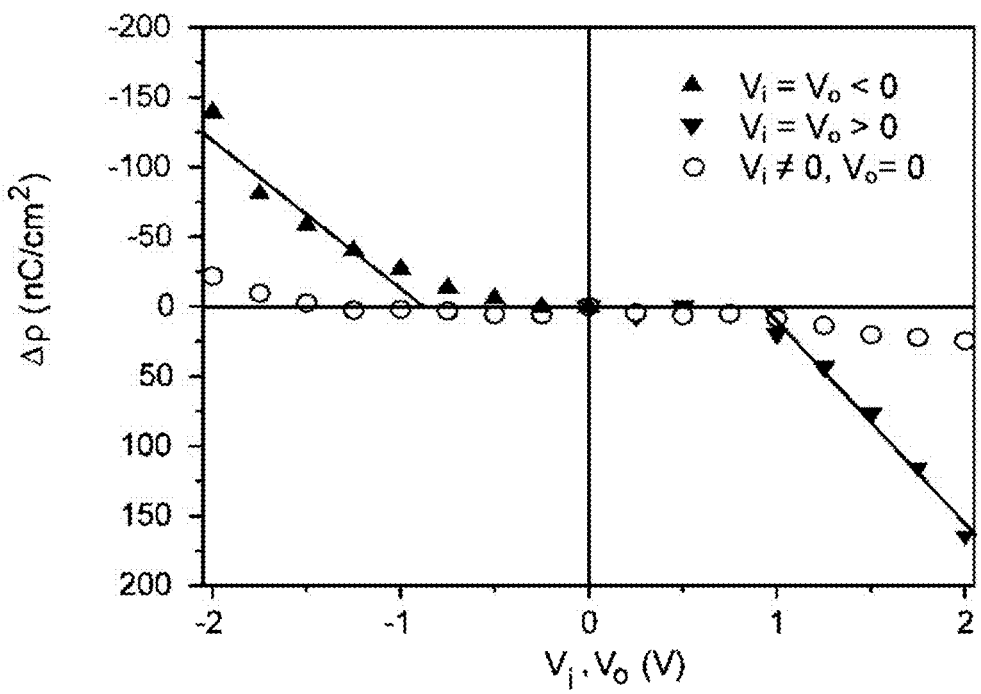

FIG. 10B provides a the change of the charge density, $\Delta\rho_s$, in the $TiO_2$ layer of a CNT-based synstor according to embodiments of the disclosure induced by various $V_i$ and $V_o$ voltage signals, where $\Delta\rho_s$ was measured by capacitance-voltage test and plotted versus the amplitudes of the $V_i$ and $V_o$ voltages. $\Delta\rho_s$ data are fitted (solid lines) by theoretical model (EQ. 6 in the following) with $\Delta\rho_s=k_\rho^+[V_a-V_t^+]$ (solid lines) under $V_i=V_o>V_t^+>0$ and $\Delta\rho_s=k_\rho^-[V_a-V_t^-]$ under $V_i=V_o<V_t^-<0$ with $k_\rho^+=-145$ nF/cm², $k_\rho^-=-106$ nF/cm², $V_t^+=0.92$ V, and $V_t^-=-0.85$ V.

Figure 11A:
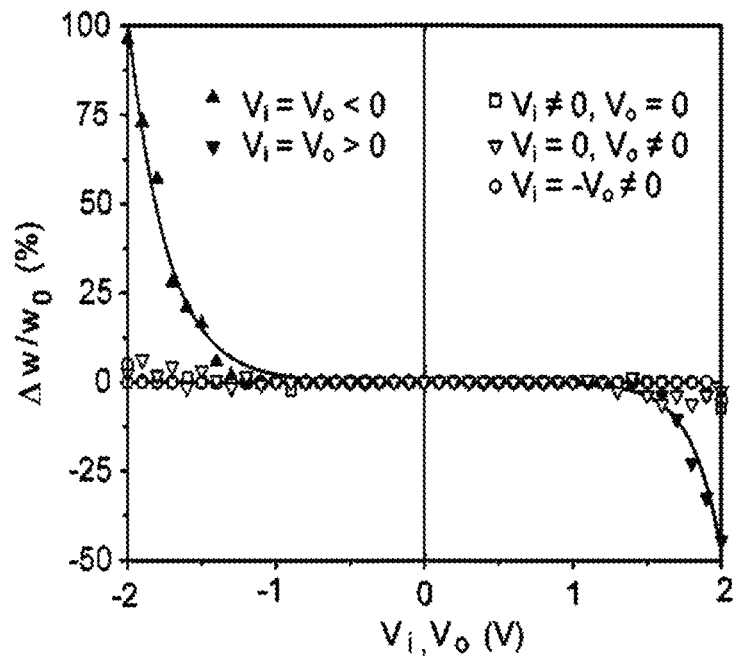

FIG. 11A provides data plots showing percentage changes of the CNT-based synstor conductance, $\Delta w/w_0$, induced by 50 pairs of various 5 ms-wide $V_i$ and $V_o$ pulses plotted versus pulse amplitude, where the $\Delta w/w_0$ data are fitted (solid lines) by theoretical model (EQ. 7 in the following).

Figure 11B:
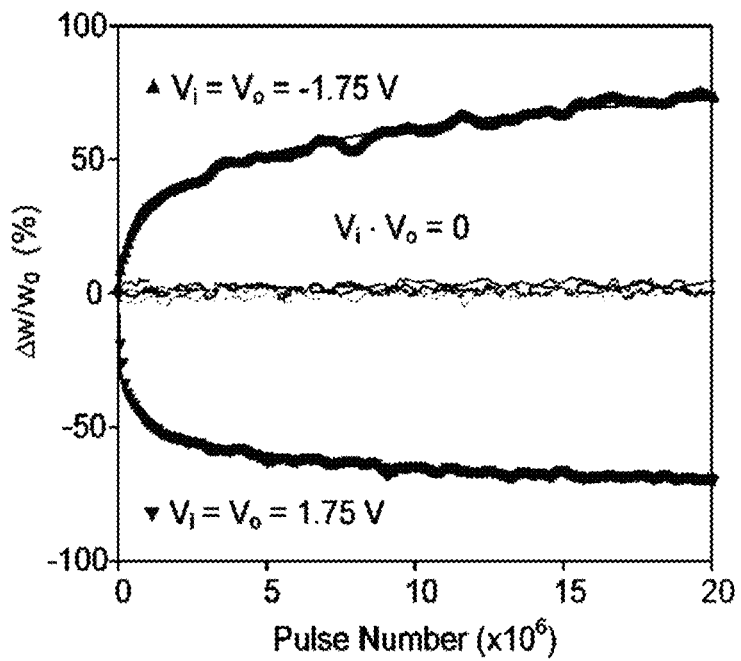

FIG. 11B provides data plots showing the percentage changes of CNT-based synstor conductance according to embodiments of the disclosure, where $\Delta w/w_0$, induced by various 10 ns-wide $V_i$ and $V_o$ pulses with $V_i=V_o=-1.75$ V (upward triangles), $V_i=V_o=1.75$ V (downward triangles), $V_i=V_o=0$, $V_i=0$ and $V_o=-1.75$ V, $V_i=0$ and $V_o=1.75$ V, $V_i=1.75$ V and $V_o=0$, and $V_i=-1.75$ V and $V_o=0$ plotted versus the applied pulse numbers, n, where the $\Delta w/w_o$ data are fitted (solid lines) by theoretical model (EQ. 7 in the following).

Figure 11C:
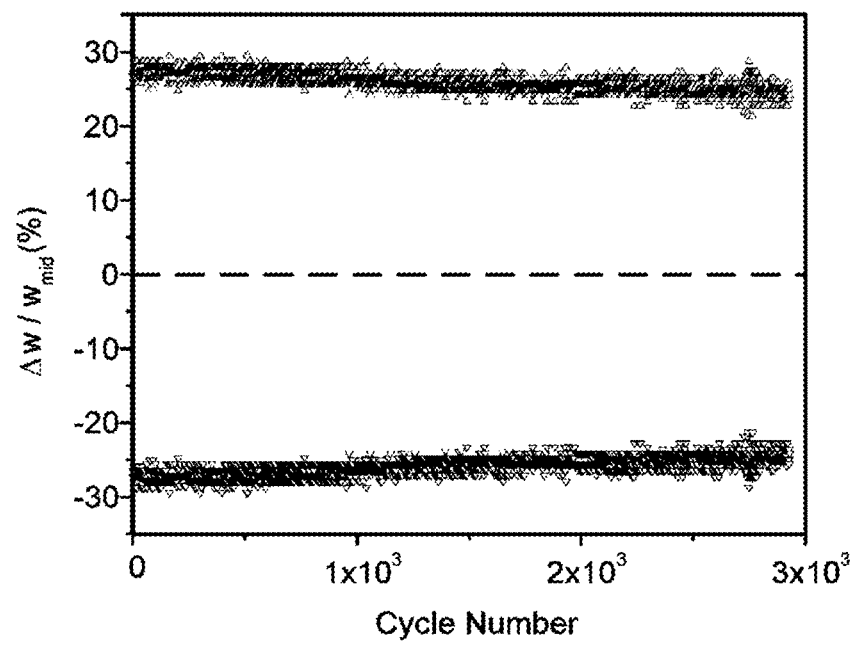

FIG. 11C provides data plots showing the conductance of a CNT-based synstor changes in modification cycles, where in each cycle, the percentage changes of the conductance, $\Delta w_H/w_{mid}=(w_H-w_{mid})/w_{mid}$ and $\Delta w_L/w_{mid}=(w_L-w_{mid})/w_{mid}$ are shown as upward and downward triangles, respectively, versus the number of modification cycles, with a mid-range conductance $w_{mid}=(w_H+w_L)^2$.

Figure 11D:
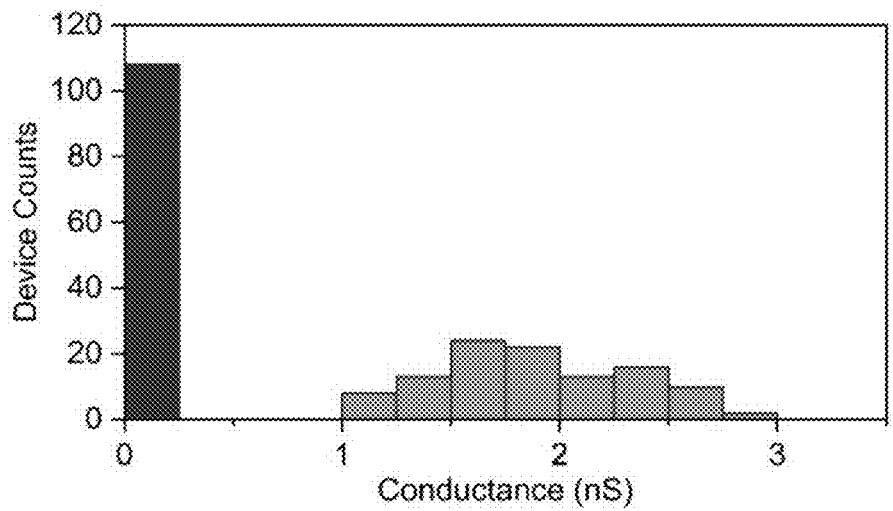

FIG. 11D provides a data plot showing results of tests on conductance of CNT-based synstors according to embodiments of the disclosure modified to their high DC conductance values, $w_H$, by applying 50 pairs of 5 ms-wide $V_i$ and $V_o$ pulses on their input and output electrodes with $V_i=V_o=-1.75$ V, and modified to their low DC conductance values, $w_L$, by applying 50 pairs of 5 ms-wide $V_i$ and $V_o$ pulses with $V_i=V_o=1.75$ V, where the distributions of $w_H$ (grey) and $w_L$ (black) of the synstors are plotted (note the synstors can be modified to an arbitrary analog conductance within the range of 0.2 nS≤w≤1 nS).

Figure 11E:
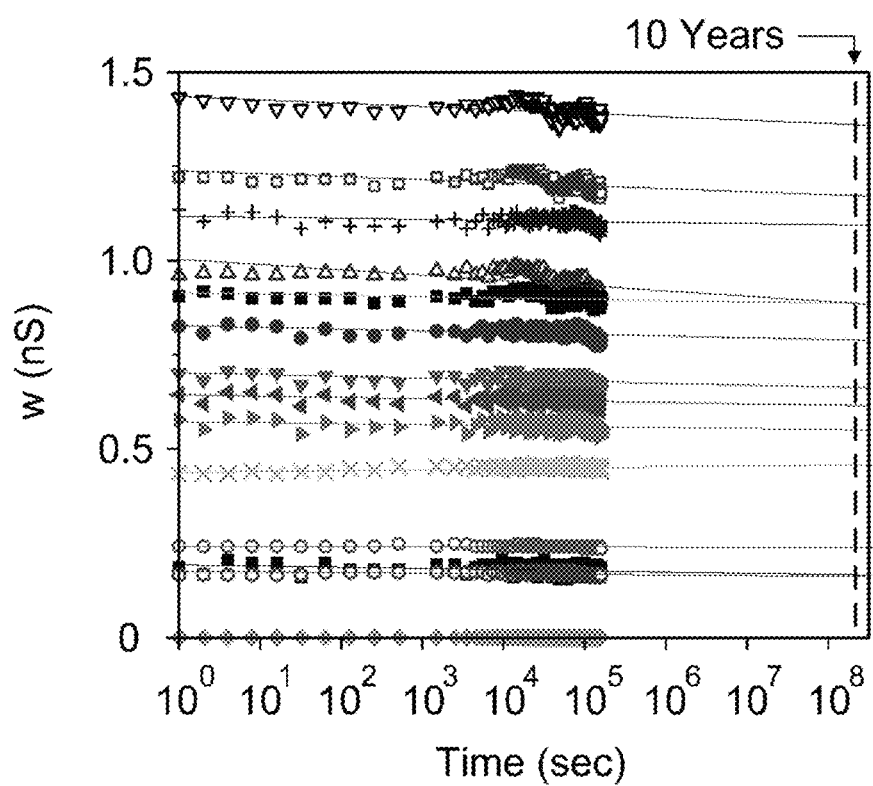

FIG. 11E provides data plots of conductance of CNT-based synstors according to embodiments of the disclosure after the synstors were modified to different initial analog conductances by applying pairs of 5 ms-wide $V_i$ and $V_o$ voltage pulses on its input and output electrodes simultaneously with $V_i=V_o=-1.75$ V or $V_i=V_o=1.75$ V, where w is shown as a function of time on a logarithmic scale, and the experimental data (dots) are fitted and extrapolated (solid lines).

FIGS. 12A to 12F provide: (A) a scheme showing the cross-sectional structure of a CNT-based synstor according to embodiments of the disclosure composed of a 200 nm-wide p-type semiconducting CNT network channel formed contacts with an Al input electrode, and an Al output electrode, and energy-band structures along the Al input electrode, the 200 nm-wide CNT network channel, and the Al output electrode, under the conditions of: (B) $V_i=V_o=-1.75$ V, (C) $V_i=V_o=1.75$ V, (D) $V_i=-1.75$ V and $V_o=1.75$ V, (E) $V_i=1.75$ V and $V_o=0$, and (F) $V_i=-1.75$ V and $V_o=0$.

FIGS. 12G to 12L provide: (G) a scheme showing the cross-sectional structure of a CNT-based synstor according to embodiments of the disclosure composed of a 40 nm-wide p-type semiconducting CNT network channel formed contacts with an Al input electrode, and an Al output electrode. Energy-band structures along the Al input electrode, the 40 nm-wide CNT network, and the Al output electrode, under the conditions of: (H) $V_i=V_o=-0.5$ V, (I) $V_i=V_o=0.5$ V, (J) $V_i=-0.5$ V and $V_o=0.5$ V, (K) $V=0.5$ V and $V_o=0$, and (L) $V=-0.5$ V and $V_o=0$.

Figure 13A:
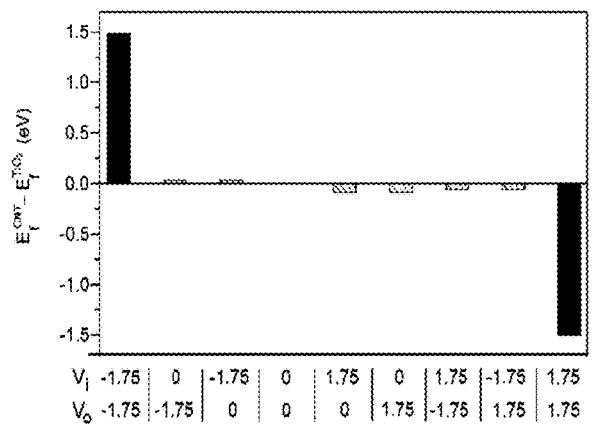

FIG. 13A provides simulated data plots of the differences between the average Fermi energies of the CNT network, $E_f^{CNT}$, and the $TiO_2$ charge storage layer, $E_f^{TiO_2}$, in a synstor according to embodiments of the disclosure with a 200 nm-wide CNT networks under various combinations of $V_i$ voltages on its input electrode, $V_o$ voltages on its output electrode, and an electrically grounded reference electrode.

Figure 13B:
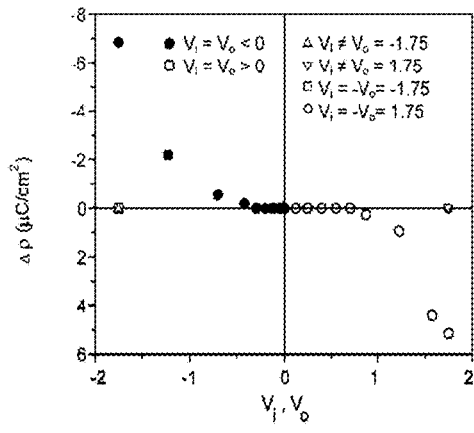

FIG. 13B provides simulated data plots of the changes of net charge density, $\Delta\rho$, in the $TiO_2$ charge storage layer induced by various $V_i$ and $V_o$ voltages applied on a CNT-based synstor according to embodiments of the disclosure with a 200 nm-wide CNT networks.

Figure 13C:
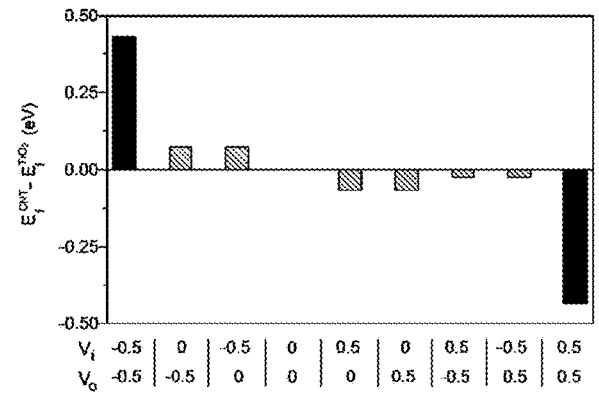

FIG. 13C provides simulated data plots of the differences between the average Fermi energies of the CNT network, $E_f^{CNT}$, and the $TiO_2$ charge storage layer, $E_f^{TiO_2}$, in a synstor according to embodiments of the disclosure with a 40 nm-wide CNT networks under various combinations of $V_i$ voltages on its input electrode, $V_o$ voltages on its output electrode, and an electrically grounded reference electrode.

Figure 13D:
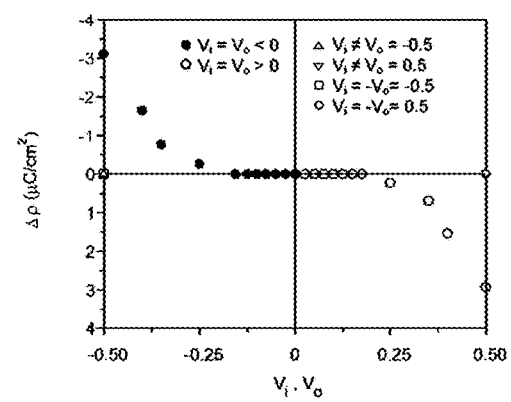

FIG. 13D provides simulated data plots of the changes of net charge density, $\Delta\rho$, in the $TiO_2$ charge storage layer induced by various $V_i$ and $V_o$ voltages applied on a CNT-based synstor according to embodiments of the disclosure with a 40 nm-wide CNT networks.

FIG. 14A provides a schematic of a 4×2 crossbar circuit composed of 72 synstors according to embodiments of the disclosure connected with two horizontal input electrodes and two vertical output electrodes, where each output electrode is connected to an integrate-and-fire "neuron" circuit, $N_1$ or $N_2$, and where the speech signals of "yes" and "no" words are converted to sets of voltage pulses, $V_i^1$, $V_i^2$, $V_i^3$, and $V_i^4$, input to the $1^{st}$, $2^{nd}$, $3^{rd}$, and $4^{th}$ electrodes to trigger currents, $I^1$ and $I^2$, on the $1^{st}$ and $2^{nd}$ output electrodes via the synstors, which in turn trigger back-propagating voltage pulses, $V_o^1$ and $V_o^2$, on the $1^{st}$ and $2^{nd}$ output electrodes and forward-propagating voltage pulses, $V_f^1$ and $V_f^2$, from the $1^{st}$ and $2^{nd}$ "neurons".

FIG. 14B provides an optical image of a synstor circuit chip according to embodiments of the disclosure with input electrodes connected with their contact pads (labeled by $V_i^1$, $V_i^2$, $V_i^3$, and $V_i^4$), output electrodes (labeled by $V_o^1$ and $V_o^2$, and $I^1$ and $I^2$), reference electrodes (labeled by "Ref"), and CNT networks connected by the serpentine input and output electrodes.

FIG. 14C provides a plot of the firing rates of +1.75 V 10 ns-wide voltage pulses ($V_i^{1+}$, $V_i^{1-}$, $V_i^{2+}$, $V_i^{2-}$, $V_i^{3+}$, $V_i^{3-}$, $V_i^{4+}$, and $V_i^{4-}$) on the four input electrodes according to embodiments of the disclosure.

FIG. 14D provides a plot of the firing rates of +1.75 V 10 ns-wide back-propagating voltage pulses ($V_o^{1+}$, $V_o^{1-}$, $V_o^{2+}$, and $V_o^{2-}$) on the two output electrodes according to embodiments of the disclosure.

FIG. 14E provides a plot of the 1.0 V output pulses generated from the two "neurons" ($V_f^1$ and $V_f^2$) versus time according to embodiments of the disclosure.

FIG. 14F provides a plot of the output of the circuit of FIG. 14A where a "no" word triggers 1.75 V $V_i^{2+}$ and $V_i^{4+}$ pulses on the $2^{nd}$ and $4^{th}$ input electrodes and a 1.75 V $V_o^{2+}$ pulse on the $2^{nd}$ output electrode concurrently, which decrease $w^{22}$ and $w^{42}$ conductances of the synstors connected with the electrodes, $-1.75$ V $V_i^{1-}$ and $V_i^{3-}$ pulses on the $1^{st}$ and $3^{rd}$ input electrodes, and a $-1.75$ V $V_o^{1-}$ pulse on the $1^{st}$ output electrode concurrently, which increase $w^{11}$ and $w^{31}$, and a "yes" word triggers 1.75 V $V_i^{1+}$ and $V_i^{3+}$ pulses on the $1^{st}$ and $3^{rd}$ input electrodes, a 1.75 V $V_o^{1+}$ on the $1^{st}$ output electrode concurrently, which decrease $w^{11}$ and $w^{31}$, and $-1.75$ V $V_i^{2-}$ and $V_i^{4-}$ pulses on the $2^{nd}$ and $4^{th}$ input electrodes, and a $-1.75$ V $V_i^{2-}$ pulse on the $2^{nd}$ output electrode concurrently, which increase $w^{22}$ and $w^{42}$ (note: the dashed lines represent the moments when the paired pulses are triggered).

Figure 15:
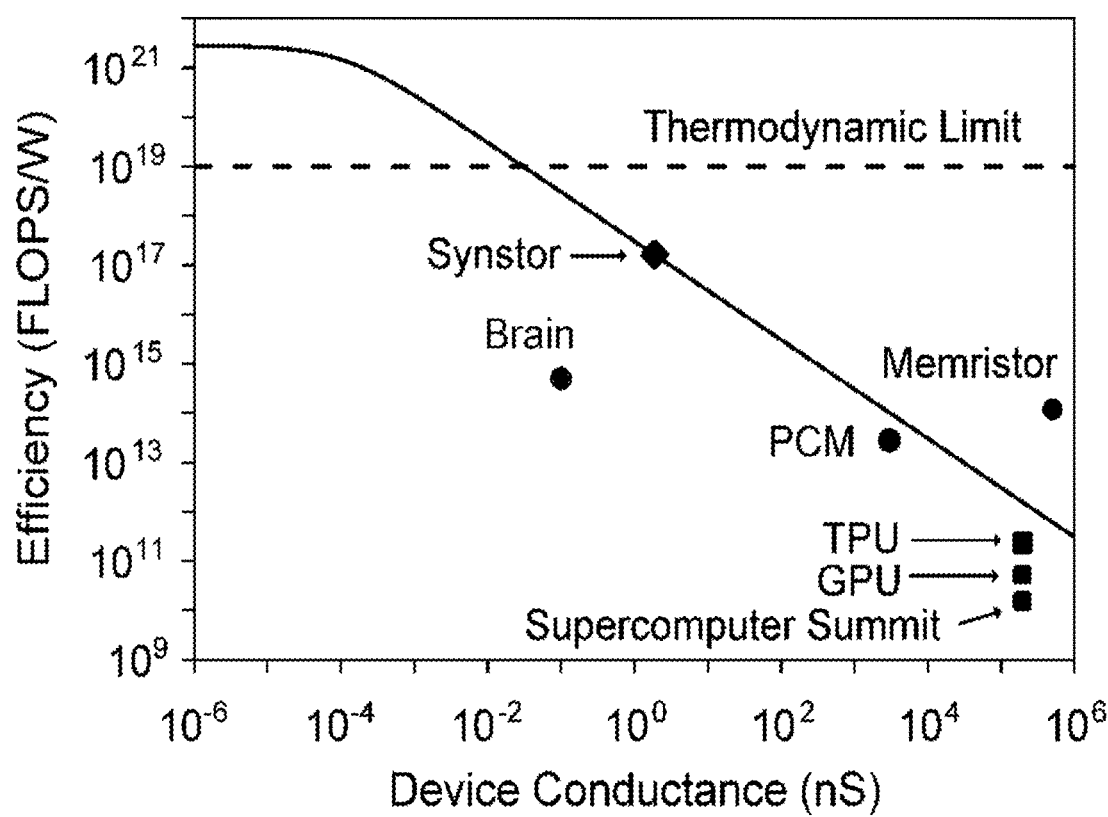

FIG. 15 provides a plot of the energy efficiencies of the Summit supercomputer, Nvidia Volta V100 graphics processing unit (GPU), Google tensor processing unit (TPU), UMass/HP memristor circuits (signal processing only, training and learning algorithm computation excluded), IBM phase change memory (PCM) circuit (training only, learning algorithm computation excluded), the human brain, 4×2 crossbar synstor circuit (solid line) according to embodiments of the disclosure (diamond), and projected 4×2 crossbar synstor circuit according to embodiments of the disclosure are displayed versus the average conductance of the Si transistors, memristors, PCM, and synstors in the circuits in the unit of nano siemens (nS) (note: the thermodynamic limit of the computing energy efficiency in digital computing circuits is shown by the dashed line).

Figure 16A:
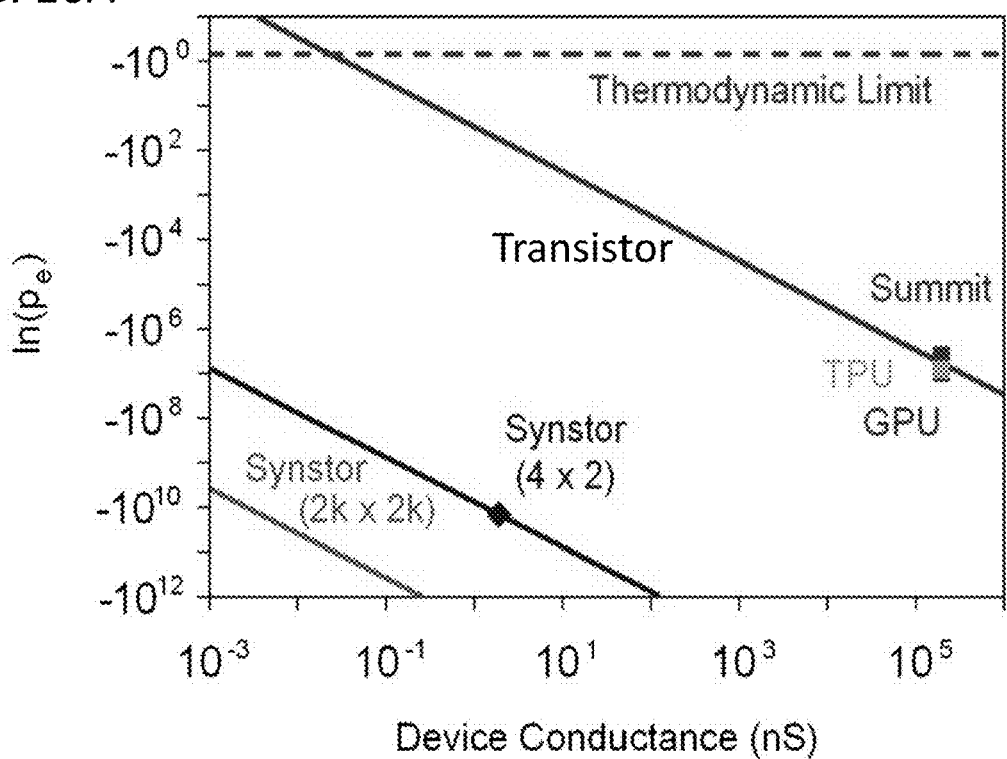

FIG. 16A provides a plot of the natural logarithm of the thermodynamic error rate, $p_e$, in a 4×2 crossbar synstor circuit according to embodiments of the disclosure, a projected 2 k×2 k crossbar synstor circuit according to embodiments of the disclosure circuit, a transistor-based computing circuit, the Summit supercomputer, Nvidia Volta V100 GPU, and Google TPU are displayed versus the conductance of the synstors and transistors (note: the thermodynamic limit is shown as a red dashed line at $p_e=0.5$).

Figure 16B:
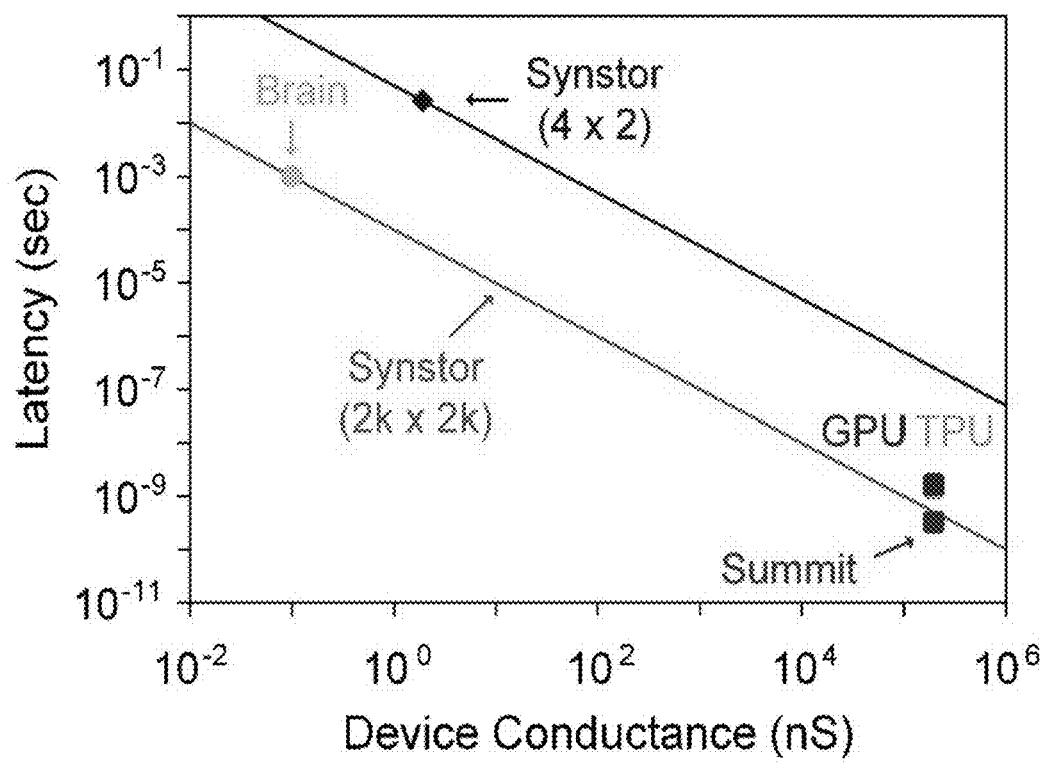

FIG. 16B provides a plot of the latency of the Summit supercomputer, Nvidia Volta V100 GPU, Google TPU, the human brain, a 4×2 crossbar synstor circuit according to embodiments of the disclosure (diamond), and a projected 2 k×2 k crossbar synstor circuit according to embodiments of the disclosure, displayed versus the conductance of the synpatic resistors, transistors, and synapses.

Figure 17:
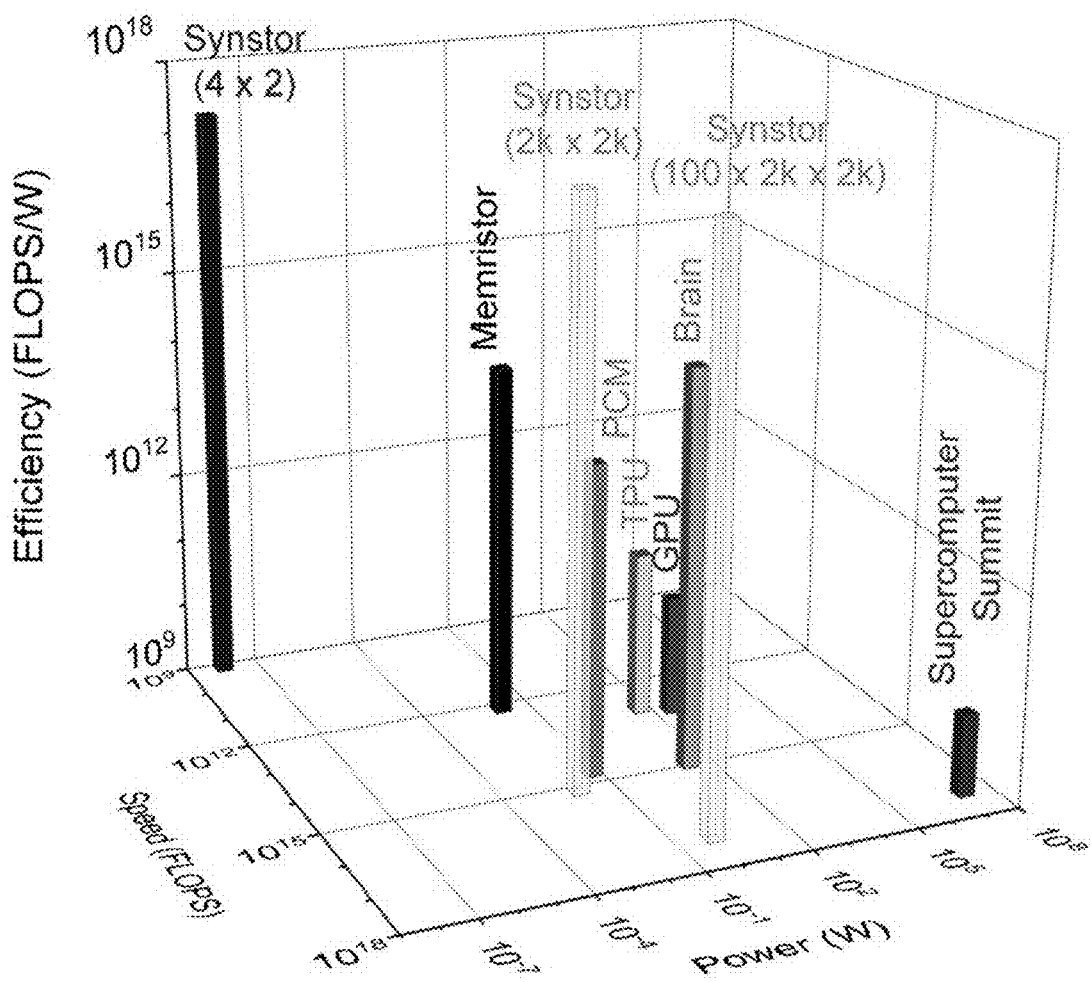

FIG. 17 provides a plot of the power consumptions, computing speeds, and energy efficiencies of the Summit supercomputer, Nvidia Volta V100 GPU, Google TPU, UMass/HP memristor circuits (signal processing only, training and learning algorithm computation excluded), IBM phase change memory (PCM) circuit (training only, learning algorithm computation excluded), the human brain, a 4×2 crossbar synstor circuit according to embodiments of the disclosure, and a projected 2 k×2 k and 100×2 k×2 k crossbar synstor circuits according to embodiments of the disclosure.

DETAILED DISCLOSURE

The embodiments of the invention described herein are not intended to be exhaustive or to limit the invention to precise forms disclosed. Rather, the embodiments selected for description have been chosen to enable one skilled in the art to practice the invention. All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims.

Overview of Embodiments

As previously discussed, a computer based on the Turing model has separate logic and memory units. As shown in FIG. 1A, based on the Turing model, digital computers execute signal processing and learning algorithms in serial mode by physically separated logic and memory transistors, and the computing energy is predominantly consumed by data memory and signal transmissions between memory and logic units, referred to as the "von Neumann bottleneck." If an M-dimensional signals includes M independent variables, each variable has K different possible values (K=2 in digital computers), and the signal contains $K^M$ different configurations. Therefore, the memory capacity, time, and energy consumption needed for the computer to transmit, process, and learn from the signals with $K^M$ different configurations in the serial computing mode shown in FIG. 1A increases with M exponentially, referred to as the "curse of dimensionality".

Digital transistors have been developed to compose circuits with parallel computing architectures and distributed memories, such as graphics processing units (GPUs) from Nvidia, tensor processing units (TPUs) from Google, field-programmable gate arrays (FPGAs) from Intel, and the TrueNorth neuromorphic circuit from IBM, to improve their speed and energy efficiencies to the range of $10^{10}$-$10^{11}$ FLOPS/W (floating point operations per second per watt) by increasing parallelism and reducing global data transmission. However, their energy efficiencies are fundamentally limited by the energy consumptions on memory (~$10^{-15}$ J/bit) and signal transitions (~10–11 J/bit) in digital computing circuits. When transistors approach the limitations of their minimal sizes near the end of Moore's law, the energy efficiencies of transistor-based computing circuits are asymptotically saturated.

By contrast, the brain circumvents these bottleneck problems by processing signals in parallel via trillions of synapses, and modifying the synapses concurrently in a parallel learning process. The analog signal processing, learning, and memory functions are integrated in each single synapse. For signal processing, when a set of input voltage pulse signals in a presynaptic neuron is processed by a synapse, wherein no voltage signal in the postsynaptic neuron, the input voltage signals induces a dynamic current via the synapse in the postsynaptic neuron. The postsynaptic current can be expressed as:

$$I(t) = \kappa \circledast (wV_i) \quad \text{(EQ. 1)}$$

where $V_i(t)$ denotes the voltage pulse signals on the presynaptic neuron, w(t) denotes the synaptic conductance (weight), κ(t) represents a kernel dynamic function, and $\kappa \circledast (wV_i)$ represents the convolution of κ(t) and w(t) $V_i(t)$. The synapse is also modified by the sets of voltage pulse signals triggered simultaneously in the presynaptic and postsynaptic neurons for learning. The modification rate of the synaptic conductance, w, can be expressed as $$\dot{w} = \alpha V_i V_o \quad \text{(EQ. 2)}$$

where $V_i$ denotes the voltage signals in the presynaptic neuron, $V_o$ denotes the voltage signals in the postsynaptic neuron, and α denotes the conductance modification coefficient. w is modified when the voltage pulse signals $V_i(t)$ ≈$V_o(t)$ with the learning coefficient α>0 in Hebbian learning, and α<0 in anti-Hebbian learning. α is a function of the timing difference, Δt, between $V_i(t)$ and $V_o(t+\Delta t)$ voltage pulse signals in the learning based on synaptic spike-timing-dependent plasticity (STDP). EQ. 2 also represents a universal correlative learning algorithm in machine learning. When a set of voltage pulse signals is triggered in the presynaptic or postsynaptic neurons, and wherein no voltage pulse signals is triggered in the presynaptic or postsynaptic neurons, the synaptic conductance is not changed for learning. Based on EQ. 2, when $V_i V_o > 0$ (i.e. $V_i(t) \approx V_o(t)$), then $\dot{w} \neq 0$; when $V_i V_o = 0$ (e.g. $V_i \neq 0$ and $V_o = 0$; or $V_o \neq 0$ and $V_i = 0$; or $V_i = V_o = 0$), then $\dot{w} = 0$, w remains unchanged as nonvolatile memory. By integrating the analog convolutional processing (EQ. 1), correlative learning (EQ. 2), a neural network in the brain can concurrently process and learn from signals. For signal processing, a set of voltage pulse signals, $V_i^m(t)$, in the $m^{th}$ presynaptic neuron is processed by synapses connected with the $m^{th}$ presynaptic and $n^{th}$ postsynaptic neurons, and induces a collective current, $I^n$, in the $n^{th}$ postsynaptic neuron. The current induces voltage pulse signals, $V_o^n(t)$, in the $n^{th}$ postsynaptic neuron. When the voltage pulse signal is fired in the $n^{th}$ postsynaptic neuron ($V_o^n \neq 0$), the output current $I^n = 0$ in the $n^{th}$ postsynaptic neuron. $I^n$ can be expressed as, $$I^n(t) = \begin{cases} \sum_m \kappa^{nm} \circledast (w^{nm} V_i^m) & \text{when } V_o^n = 0 \\ 0 & \text{when } V_o^n \neq 0 \end{cases} \quad \text{(EQ. 3)}$$

where $w^{nm}$ denotes the conductance of the synstor(s), $\kappa^{nm}(t)$ denotes a temporal kernel function, and $\kappa^{nm} \circledast (w^{nm} V_i^m)$ represents the temporal convolution between $w^{nm} V_i^m$ and $V_i^m(t)$. The conductance matrix of the synapses, $[W^{nm}]_{N,M}$ in the neuronal network is also modified concurrently by the sets of voltage signals in the input and output electrodes for learning, $$\dot{w}^{nm} = \alpha V_i^m V_o^n \quad \text{(EQ. 4)}$$

The brain processes (EQ. 3) and learns (EQ. 4) from "big data" concurrently in analog parallel mode with an estimated speed of ~$10^{16}$ FLOPS comparable to the fastest supercomputer, Summit (~$10^{17}$ FLOPS), but the brain consumes a power of ~20 W, much less than the power of the supercomputer (~$10^7$ W), and the brain is much more energy-efficient (~$10^{15}$ FLOPS/W) than the supercomputer (~$10^{10}$ FLOPS/W). In summary, by integrating the analog convolutional processing (EQ. 1), correlative learning (EQ. 2), and nonvolatile memory functions in a single synapse, the brain circumvents the fundamental limitations such as physically separated memory units, data transmission between memory and logic units in computers as shown in FIG. 1A, and concurrently executes the signal processing (EQ. 3) and learning (EQ. 4) in the brain in analog parallel mode, as shown in FIG. 1B, with an energy-efficient more than five orders of magnitudes higher than that of the computers.

The circuits of the existing electronic devices, such as transistors, memristors, and phase change memory (PCM) devices, cannot execute the signal processing (EQ. 1) and correlative learning (EQ. 2) algorithms concurrently in parallel mode, which limits their speeds and energy efficiencies for processing and learning from "big data". The devices in their circuits still need to be modified in serial learning processes by the signals from peripheral memory, signal processing, and/or control circuits, which limits the speeds and energy efficiencies of their circuits for learning ($\leq 10^{11}$ FLOPS/W).

To address the said limitations and inefficiencies of the circuits of existing electronic devices, embodiments are directed to circuits of synstors that capable of facilitating concurrent parallel signal processing and learning with high speed and energy efficiency, as shown schematically in FIG. 1B.

As illustrated in FIG. 2, a synstor (1) comprises an input electrode (2), an output electrode (3), and a reference electrode (4) connected with a body (5) of the device. Although the body of the synstor device is shown as a single monolithic structure, it will be understood that it may be comprised of multiple layers or structures that combine to accomplish the proscribed function of the structure within the device.

Such a synstor has analog signal processing, memory and learning functions of biological synapse. The synstor is configured to apply a zero or a constant voltage to the reference electrode (4). When no voltage signals are applied on the input (2) and output (3) electrodes, a standby zero voltage or a standby constant voltage is applied on the input and output electrodes. Sets of voltage signals are applied on the input and output electrodes with respect to the standby voltage. The voltage signals can be voltage pulses with fixed amplitudes and temporal durations for signal processing and learning.

According to embodiments a synstor is configured for signal processing when a set of input voltage signals is applied on the input electrode (2), wherein no voltage signal is applied on the output electrode (3), the set of the input voltage signals induces a dynamic output current on the output electrode (3). The output current can be expressed as, $$I(t)=K\circledast(wV_i) \quad \text{(EQ. 1)}$$

where $V_i$ denotes the voltage signals on the input electrode, w(t) denotes the synstor conductance, κ(t) represents a kernel function, and $\kappa\circledast(wV_i)$ represents the convolution of κ(t) and w(t) $V_i$(t).

When a set of voltage signals is applied to the input electrode (2), wherein a set of voltage signals with the same or similar amplitudes as the voltage signals is applied to the output electrode (3) simultaneously, the conductance of the synstor is changed in analog mode for learning; when a set of voltage signals is applied to one of either the input (2) or the output electrode (3), and wherein no voltage signals or a set of voltage signals with different polarities is applied to the other of either the input or output electrode simultaneously, or when no voltage signals is applied to either the input (2) or the output electrode (3), the conductance of the synstor is not changed for learning. The change rate of the conductance of the synstor, w, can be expressed as, $$\dot{w}=\alpha V_i V_o \quad \text{(EQ. 2)}$$

where $V_i$ denotes the voltage signals on the input electrode, $V_o$ denotes the voltage signals on the output electrode, and α denotes the conductance modification coefficient. When $V_i V_o>0$, then $\alpha\neq 0$ and $\dot{w}\neq 0$; when $V_i V_o\leq 0$, then $\alpha=0$ and $\dot{w}=0$.

When a set of voltage signals is applied to one of either the input (2) or the output electrode (3), and wherein no voltage signals or a set of voltage signals with different polarities is applied to the other of either the input or output electrode simultaneously, or when no voltage signals is applied to either the input (2) or the output electrode (3), or when no external voltages are applied to either the input or the output or the reference electrode the conductance of the synstor remains unchanged as memory, i.e. $\dot{w}=0$, under $V_i V_o\leq 0$.

According to many embodiments, such synstor devices may have a structure as illustrated in FIGS. 3A and 3B. As shown in FIG. 3A, in many embodiments the synstor device (10) generally comprises a semiconducting channel (12) that is connected to an input (14) and an output (16) electrodes. The synstor device also comprises a dielectric layer (18) disposed adjacent the channel. The device also comprises a charge storage material (20) buried within the dielectric layer (18), and a reference electrode (24) disposed adjacent to the dielectric layer (18). As shown in FIG. 3B, the synstor device may also comprise a dielectric layer (18) disposed adjacent the channel (12) and contacted with the multiple sides of the channel (12). The device may also comprise a charge storage material (20) buried within the dielectric layer (18), and a reference electrode (24) buried within the dielectric layer (18) around the multiple sides of the channel (12). The synstor has a transistor-like structure, but its reference electrode is always grounded, and it does not need a programmed gate voltage to control the current between the input and output electrodes like a transistor. Although each of the structures of the synstor device is shown as a single monolithic structure, it will be understood that each may be comprised of multiple layers or structures that combine to accomplish the proscribed function of the structure within the device.

Although FIGS. 3A and 3B are schematic and not to be taken as a "to-scale" drawing of a synstor according to embodiments, it will be understood that relative dimensions of certain elements of the synstor are contemplated as being part of the current disclosure. In many embodiments, as shown in FIGS. 3A and 3B, at least a portion of the dielectric layer (18) is sandwiched between the charge storage material (20) and the semiconducting channel (12) such that the dielectric layer (18) ensures that when the magnitude of the voltage difference between the channel (12) and the charge storage material (20) is smaller than a threshold value, the voltage difference is insufficient to drive charge through the dielectric layer (18) to modify the charge storage material (20) such that the net charge within the charge storage material (18) remains unchanged after the voltage difference is applied; when the magnitude of the voltage difference between the channel (12) and the charge storage material (20) is larger than a threshold value, the voltage difference is sufficient to drive charge through the dielectric layer (18) to modify the charge storage material (20) such that the charge within the charge storage material (20) is changed before and after the voltage difference is applied. For the same reasons, in various embodiments, as shown in FIG. 4A and FIG. 4B, the thickness (32) of the dielectric layer (18) between the charge storage material (20) and the semiconducting channel (12) is adjusted to its optimized value.

In many embodiments, at least a portion of the dielectric layer (18) is disposed between the charge storage material (20) and the reference electrode (24) such that the dielectric layer (18) ensures that the voltage differences between the charge storage material (20) and the reference electrode (24) are insufficient to drive charge through the dielectric layer (18). For the same reason, in various embodiments, as shown in FIGS. 4A and 4B, the thickness (34) of the dielectric layer (18) between the charge storage material (20) and the reference electrode (24) is adjusted to its optimized value. For the same reasons, in various embodiments, as shown in FIGS. 4A and 4B, the thickness (34) of the dielectric layer (18) between the charge storage material (20) and the reference electrode (24) may be larger than the thickness (32) of the dielectric layer (18) between the charge storage material (20) and the semiconducting channel (12).

The combination of the input electrode (14), the semiconducting channel (12), and the output electrode (16) form a resistor. The combination of the semiconducting channel (12), the dielectric layer (18), the charge storage material (20) forms a capacitor. The charge storage material (20), the dielectric layer (18), and the reference electrode (24) form a capacitor. The two capacitors are connected in series to form a capacitor between the semiconducting channel (12) and the reference electrode (24).

The synstor is configured to apply a zero or a constant voltage to the reference electrode (24). When no voltage signals are applied on the input (14) and output (16) electrodes, a standby zero voltage or a standby constant voltage is applied on the input and output electrodes. Sets of voltage signals are applied on the input and output electrodes with respect to the standby voltage. The voltage signals can be voltage pulses with fixed amplitudes and temporal durations for signal processing and learning.

According to embodiments a synstor is configured such that during signal processing when a set of input voltage signals is applied on the input electrode (14), wherein no voltage signal is applied on the output electrode (16), a synstor processes a set of voltage signals on its input electrode (14) by inducing an output current on the output electrode through the resistors, and charging the capacitor between the semiconducting channel (12) and the reference electrode (24) during the voltage signals, and discharging the capacitor after the voltage signals, and triggering a dynamic current on the output electrode (16). The output current can be expressed as $$I(t) = \kappa \circledast (wV_i) \qquad \text{(EQ. 1)}$$

where $V_i$ denotes the voltage signals on the input electrode, w(t) denotes the synstor conductance, κ(t) represents a kernel function, and $\kappa \circledast (wV_i)$ represents the convolution of κ(t) and w(t) $V_i$(t).

According to embodiments a synstor is configured such that during learning when a set of voltage signals is applied to the input electrode (14), wherein a set of voltage signals with the same or similar amplitudes as the voltage signals is applied to the output electrode (16) simultaneously, the sets of the voltage signals generates a voltage difference between the channel (12) and the charge storage material (20) across the dielectric layer (18), which has an magnitude larger than the threshold value and is sufficient to drive charge through the dielectric layer (18) to modify the charge storage material (20), such that the net charge within the charge storage material (18) is changed. In such embodiments, the change of the net charge within the charge storage material (18) induces the change of the carrier concentration in the semiconducting channel, such that the conductance of the synstor is changed in analog mode for learning. When a set of voltage signals is applied to one of either the input or the output electrode and wherein no voltage signal or a set of voltage signals with the opposite polarity is applied to the other of either the input or output electrode simultaneously, or when no voltage signals is applied to either the input or the output electrode, the set of the voltage signals only generates a voltage difference between the channel (12) and the charge storage material (20) across the dielectric layer (18), which has an magnitude smaller than the threshold value and is insufficient to drive charge through the dielectric layer (18) to modify the charge storage material (20). In such embodiments, the net charge within the charge storage material (18) remains unchanged, and the conductance of the synstor is not changed for learning. When no voltage signals is applied to either the input (14) or the output electrode (16), the voltage difference between the channel (12) and the charge storage material (20) across the dielectric layer (18) has an magnitude smaller than the threshold value and is insufficient to drive charge through the dielectric layer (18) to modify the charge storage material (20). In such embodiments, the net charge within the charge storage material (18) remains unchanged, and the conductance of the synstor is not changed for learning. The change rate of the conductance of the synstor, w, can be expressed as $$\dot{w} = \alpha V_i V_o \qquad \text{(EQ. 2)}$$

where $V_i$ denotes the voltage signals on the input electrode, $V_o$ denotes the voltage signals on the output electrode, and α denotes the conductance modification coefficient. When $V_i V_o > 0$, then $\alpha \neq 0$ and $\dot{w} \neq 0$; when $V_i V_o \leq 0$, then $\alpha = 0$ and $\dot{w} = 0$.

When a set of voltage signals is applied to one of either the input or the output electrode and wherein no voltage signal or a set of voltage signals with the opposite polarity is applied to the other of either the input or output electrode simultaneously, or when no voltage signals is applied to either the input or the output electrode, or when no external voltages is applied to either the input or the output or the reference electrode for the same reason, the conductance of the synstor remains unchanged as memory, i.e. $\dot{w} = 0$, under $V_i V_o < 0$.

In many embodiments, the input/output electrodes (14/16) and the channel (12) form a contact with a contact resistance which is comparable with or larger than the resistance of the channel (12) such that when a set of voltage signals is applied to one of either the input (14) or the output electrode (16), and wherein no voltage signals or a set of voltage signals with different polarities is applied to the other of either the input or output electrode simultaneously, or when no voltage signals is applied to either the input (14) or the output electrode (16), the voltage drops across the contact region(s) between the input/output electrode (14/16) and the channel (12), and the lateral spaces beyond the charge storage material (20). In such embodiments, the voltage difference between the channel (12) and the charge storage material (20) across the dielectric layers (18) induced by the voltage signal(s) has an magnitude smaller than the threshold value and is insufficient to drive charge through the dielectric layer (18) to modify the charge storage material (20), such that the net charge within the charge storage material (18) and the conductance of the synstor remains unchanged for memory and learning.

In many other embodiments, the input/output electrodes (14/16) form Schottky barriers with the channel (12) such that when a set of voltage signals is applied to one of either the input (14) or the output electrode (16), and wherein no voltage signals or a set of voltage signals with different polarities is applied to the other of either the input or output electrode simultaneously, or when no voltage signals is applied to either the input (14) or the output electrode (16), the voltage mainly drops across the contact region between the input/output electrode and the channel, and the lateral spaces beyond the charge storage material (20). Again, in such embodiments, the voltage difference between the channel (12) and the charge storage material (20) across the dielectric layers (18) induced by the voltage signal(s) has an magnitude smaller than the threshold value and is insufficient to drive charge through the dielectric layer (18) to modify the charge storage material (20), such that the net charge within the charge storage material (18) and the conductance of the synstor remains unchanged for memory and learning.

As shown in FIGS. 4A and 4B, in various embodiments the channel (22) is dimensioned to have the channel length (26) be longer than the length (28) of the charge storage material (20) such that when a set of voltage signals is applied to one of either the input (14) or the output electrode (16), and wherein no voltage signals or a set of voltage signals with different polarities is applied to the other of either the input or output electrode simultaneously, the voltage drop occurs prior to the spatial occurrence of the charge storage material to ensure that the voltage difference between the channel (12) and the charge storage material (20) has an magnitude smaller than the threshold value and is insufficient to drive charge through the dielectric layer (18) to modify the charge storage material (20) and the synstor conductance. For the same reasons, in various embodiments, the length (30) of the reference electrode (24) is also configured to be longer than or equal to the length (28) of the charge storage material (20). For the same reasons, in many embodiments, the length (26) of the channel is longer than the length (30) of the reference electrode (24). To modify the carriers in the channel (12) by the charge storage material (20), in many embodiments, the width (not shown) of the charge storage material is wider than or equal to the width (not shown) of the channel. For the same reasons, in many embodiments, the width (not shown) of the reference electrode is wider than or equal to the width (not shown) of the charge storage material (20). A further discussion of the operation of synstors in accordance with many embodiments is further described below.

Turning to the materials used in the construction of the various structures, various embodiments the channel (12) in the synstor device may comprise a semiconducting material selected from but not limited to carbon nanotube, Si, graphene, Ge, SiC, ZnO, InO, InP, TiO$_2$, Cu$_2$O, GaN, GaAs, MoS$_2$, MoSe$_2$, WS$_2$, WSe$_2$, GaSe, GaTe, FeTe, polymers, and molecules, etc. In many embodiments, the channel length (26) may range between about 5-10$^6$ nm, the channel width may range between about 5-10$^6$ nm, and the channel thickness may range between about 0.1-10$^5$ nm.

In various embodiments the input (14) and output (16) electrodes in the synstor device may comprise metals, such as, for example, Ti, Al, Au, Ni, Pt, Cu, etc. or semiconductor such as selected from but not limited to carbon nanotube, Si, graphene, Ge, SiC, ZnO, InO, InP, TiO$_2$, Cu$_2$O, GaN, GaAs, MoS$_2$, MoSe$_2$, WS$_2$, WSe$_2$, GaSe, GaTe, FeTe, and polymers, etc.

I" various embodiments the dielectric layers (18) in the synstor device may comprise insulative materials selected from but not limited to HfO$_2$, Al$_2$O$_3$, SiO$_2$, Si$_3$N$_4$, Si, C, Ge, SiC, ZnO, InO, InP, TiO$_2$, Cu$_2$O, GaN, GaAs, etc. or polymers, and molecules. In many embodiments, the length of the dielectric layer may range between about 5-10$^6$ nm, the width of the first dielectric layer may range between about 5-10$^6$ nm. In many embodiments, the thickness (32) of the dielectric layer (18) between the charge storage material (20) and the semiconducting channel (12) may range between about 0.2-10$^2$ nm. In many embodiments, the thickness (34) of the dielectric layer (18) between the charge storage material (20) and the reference electrode (24) may range between about 0.5-10$^3$ nm.

In various embodiments, the charge storage material (22) may comprise continuous or distributed charge storage materials buried within the dielectric layer (18). In many embodiments the charge storage materials may comprise molecules such as C60, nanoparticles such as Au nanoparticles, semiconductor quantum dots, impurities such as, for example, dopants and implanted ions inside the material, and defects inside the material, such as, for example, vacancies, impurity, semiconducting films selected from but not limited to Si, C, Ge, SiC, ZnO, InO, InP, TiO$_2$, Cu$_2$O, GaN, GaAs, dielectric materials selected from but not limited to TiO$_2$, SiO$_2$, Si$_3$N$_4$, HfO$_2$, Al$_2$O$_3$, or metals selected from but not limited to Ti, Al, Au, Ni, Pt, Cu, etc. I" many embodiments, the dimensions of the charge storage material may range between about 0.2-10$^2$ nm.

In various embodiments the reference electrode (24) in the synstor device may comprise metals selected from but not limited to Ti, Al, Au, Ni, Pt, Cu, or semiconducting materials selected from but not limited to carbon nanotube, Si, graphene, Ge, SiC, ZnO, InO, InP, TiO$_2$, Cu$_2$O, GaN, GaAs, MoS$_2$, MoSe$_2$, WS$_2$, WSe$_2$, GaSe, GaTe, FeTe, and polymers, etc.

Although specific materials and combinations of materials are described above, it will be understood that any suitable combination of such materials may be used where appropriate such that the overall functions of the synstor device is preserved.

As discussed above, the synstor device according to embodiments is configured to provide analog signal processing, memory, and learning functions in a single device. Additional advantages may include, but are not limited to, the following:

The synstor device integrates the elementary signal processing, learning, and memory functions of a biological synapse.

When a set of input voltage signals is applied on the input electrode, wherein no voltage signal is applied on the output electrode, the input voltage signals can trigger dynamic currents on its output electrode from the synstor device to emulate the various dynamic properties of a synapse (as discussed with respect to EQ. 1) such as an excitatory post-synaptic current (EPSC) or an inhibitory post-synaptic current (IPSC). When a set of voltage signals is applied to the input electrode, wherein a set of voltage signals with the same or similar amplitudes as the voltage signals is applied to the output electrode simultaneously, the conductance of the synstor are changed in analog mode for learning; otherwise, when a set of voltage signals is applied to one of either the input or the output electrode, and wherein no voltage signals or a set of voltage signals with different polarities is applied to the other of either the input or output electrode simultaneously, or when no voltage signals is applied to either the input or the output electrode, the conductance of the synstor is not changed for learning. The conductance of the synstor device can be modified to analog values like a biological synapse (as discussed with respect to EQ. 2).

The device's analog configuration function enables the synstor device to have an analog "learning" capability.

When a set of voltage signals is applied to one of either the input or the output electrode, and wherein no voltage signals or a set of voltage signals with different polarities is applied to the other of either the input or output electrode simultaneously, or when no voltage signals is applied to either the input or the output electrode, or when no external voltages is applied to either the input or the output or the reference electrode, the charge concentrations in the charge storage layer and device conductance will remain unchanged as memory.

The synstor device can be operated as a signal processing, learning, and memory devices in one.

The device consumes very low energy during operation. The power consumption of a synstor (and its circuit) decreases with decreasing synstor conductance, therefore the power consumption of the device (and its circuit) can be reduced by decreasing synstor conductance. The synstor device consumes only a small fraction of energy of the existing electronic devices.

The device can be fabricated based on the fabrication technology of nanoscale transistor and semiconductor materials. The size of the device can be reduced to extremely small, and its size is only a small fraction of the biological synapse.

The small size, low-power-consumption device can be used as the basic element to fabricate circuits with the concurrent signal processing and learning functions of the brain.

Embodiments of Synstor Circuits

Although the above discussion has focused on the architecture, materials and function of synstor devices according to certain embodiments, various other embodiments are directed to the integration of synstors in circuits. In many embodiments, as illustrated in FIG. 5, synstors can form an M×N circuit with M input electrodes (54) and N output electrodes (56). In such a circuit, input electrodes are connected with output electrodes by a synstor or multiple synstors (58).

Using a circuit in accordance with such embodiments circumvents the bottleneck problems of conventional computers by processing voltage signals in parallel, and modifying the conductances of the synstors concurrently in a parallel learning process. As shown in FIG. 5, for signal processing, a set of voltage signals, $V_i^m(t)$, in the $m^{th}$ input electrode is processed by a synstor (or synstors) connected with the $m^{th}$ input and $n^{th}$ output electrodes, and induces a current in the $n^{th}$ output electrode, $I^{nm} = \kappa_{nm} \circledast (w^{nm} V_i^m)$ (EQ. 1), where $w^{nm}$ denotes the conductance of the synstor(s), $\kappa^{nm}(t)$ denotes a temporal kernel function, and $\kappa^{nm} \circledast (w^{nm} V_i^m)$ represents the temporal convolution between $w^{nm} V_i^m$ and $V_i^m(t)$. For signal processing, a set of voltage signals in input electrodes induces a collective current $I^n = \Sigma_m I^{nm}$ via synstors in the $n^{th}$ output electrode, and the current induces voltage signals, $V_o^n(t)$, in the $n^{th}$ output electrode (e.g. from external "integrate-and-fire" circuits).

When the voltage signal is fired in the output electrode ($V_o^n \neq 0$), the output current $I^n = 0$. Thus $I^n$ can be expressed as, $$I^n(t) = \begin{cases} \sum_m \kappa^{nm} \circledast (w^{nm} V_i^m) & \text{when } V_o^n = 0 \\ 0 & \text{when } V_o^n \neq 0 \end{cases} \quad (EQ. 3)$$

The synstor conductance matrix, $[w^{nm}]^{N,M}$ is also modified concurrently by the spatiotemporal sets of voltage signals in the input and output electrodes for learning, $$\dot{w}^{nm} = \alpha V_i^m V_o^n \quad (EQ. 4)$$

where $\alpha$ denotes the conductance modification coefficient. By integrating the analog convolutional processing (EQ. 1), correlative learning (EQ. 2), and nonvolatile memory functions in a single synstor, the synstor circuit in accordance with embodiments concurrently executes the signal processing (EQ. 3) and correlative learning (EQ. 4) algorithms in a circuit in analog parallel mode.

Synstor circuits in accordance with embodiments may be advantageous in various ways, which include but are not limited to the following:

The synstor circuits can concurrently process and learn from signals in analog parallel mode.

The synstor circuit can execute real-time learning when the circuit is processing signals.

The synstor circuit circumvents the fundamental limitations such as physically separated memory units, data transmission between memory and logic units, execution of signal processing and learning algorithms in serial mode in computers.

The time for a synstor circuit to process and learn from large-dimensional signals in the parallel mode does not increase with signal dimensions (M and N). The speed for the circuit to process and learn from large-dimensional signals increases with the circuit dimension (M and N).

The synstor circuit circumvents the power consumptions for separated memory and signal transmission between the memory and logic circuits in computers.

The power consumption of the synstor circuit can be further improved by decreasing synstor conductance.

The memory capacity of the nonlinear synstor circuit increases with signal/circuit dimensions.

The speed and energy efficiency of synstor circuits for processing and learning from "big data" can be much higher than existing electronic circuits.

By shrinking synstors to nanoscale, synstor circuits can be scaled up for real-time learning from "big data" with speed, power consumption, memory capacity, and learning capability superior to computers and existing electronic circuits.

By integrating synstor circuits with nonlinear "integrate-and-fire" circuits, the circuits can be applied to in-situ and real-time learning to self-program circuit in dynamic environments.

Exemplary Embodiments

Although the description herein contains many details, these should not be construed as limiting the scope of the disclosure but as merely providing illustrations of some of the presently preferred embodiments. Therefore, it will be appreciated that the scope of the disclosure fully encompasses other embodiments, which may become obvious to those skilled in the art.

Exemplary Synstor

An exemplary carbon nanotube (CNT) synstor is shown in FIG. 6. The synstor (10) has an input electrode (14), an output electrode (16), a semiconducting channel (12), a charge storage layer (20) embedded in a dielectric layer (18), and a reference electrode (24). In an exemplary embodiment the synstor is composed of a 20 µm-wide p-type semiconducting CNT network as the channel (12) which forms Schottky contacts with the Al input (14) and output (16) electrodes. The CNT networks are fabricated on a 6.5 nm-thick $HfO_2$ dielectric layer (18) on a 2.5 nm-thick and 10 µm-wide $TiO_2$ charge storage layer (24) on a 22 nm-thick $HfO_2$ dielectric layer (18) on a 50 nm-thick and 10 µm-wide Al reference electrode (24). There is a 5 µm lateral space between the $TiO_2$ charge storage layer/Al reference electrode and Al input/output electrodes.

Methods of Fabrication

In various exemplary embodiments of methods to fabricate CNT synstors, as shown In FIG. 7, an Al film was deposited on a $SiO_2$ film on a Si wafer by e-beam evaporation and patterned by photolithography and chemical etching to produce a 10 µm wide reference electrode. A 22 nm thick $HfO_2$ film and a 2.5 nm thick $TiO_2$ film were deposited by atomic layer deposition (ALD). The $TiO_2$ film was patterned by photolithography and reactive ion etching (RIE) to make a 10 µm charge storage layer aligned to the Al reference electrode, and capped by a 6.5 nm thick $HfO_2$ film by ALD. A network of randomly oriented CNTs was deposited from a 99.9% pure semiconducting single-wall CNT solution by immersion coating, and capped by an Al film deposited by e-beam evaporation. The Al film was patterned by photolithography and chemical etching to produce an input and an output electrode. The chip surface was coated with a monolayer poly (L-lysine) film by immersing the chip in a poly(L-lysine) (PLL) solution. A percolating carbon nanotube (CNT) network was then deposited by immersing the PLL-coated chip into an aqueous CNT solution. 50 nm thick Al input and output electrodes were fabricated by the same process used for the Al reference electrode, as described previously, and the CNT network was connected with the Al input and output electrodes. The CNTs were doped to p-type by adsorbing $O_2$ acceptors from the atmosphere, capped by a Parylene-C polymer film, and patterned by photolithography with a SU-8 photoresist and $O_2$ RIE.

Operation and Testing Methods

The reference electrodes of the exemplary CNT synstors were always electrically grounded during the tests. When no voltage signals are applied on the input and output electrodes of the synstors, the input and output electrodes are also electrically grounded. Current-voltage (I-V) characteristics were measured by a Keithley 4200 semiconductor parameter analyzer. The electrical voltage signals ($V_i$ and $V_o$) applied to the input and output electrodes of the devices and circuits were generated by a field programmable gate array (FPGA), computer-controlled modules (National Instruments), and a Tektronix AFG3152C waveform/function generator. Currents flowing through synstors were measured by a semiconductor parameter analyzer, computer-controlled circuit modules (National Instruments), and oscilloscope (Tektronix). The DC conductance of the devices was derived from the currents measured by applying negative voltage signals with a duration of 5 ms and a magnitude equal to the voltages applied for learning. Testing protocols were programmed (NI LabVIEW) and implemented in an embedded field-programmable gate array (FPGA, Xilinx), a microcontroller, and a reconfigurable I/O interface (NI CompactRIO).

The exemplary devices and circuits were simulated by Technology Computer-Aided Design (TCAD) simulator (Sentaurus Device, Synopsys). The simulator performed numerical simulations of device physics based on partial differential equations of electrostatics, quantum mechanics, and carrier transport under a set of boundary conditions defined by device structures, and electronic properties and band diagrams were extracted from the simulations. Transient and quasi-stationary simulations were conducted under different voltage biases on the Al input/output electrodes with respect to the grounded reference electrodes. The electric properties and power consumptions of the circuits were also analyzed by the simulations.

Exemplary Physical Models and Testing Results of Signal Processing in Synstor Embodiments In exemplary embodiments a voltage pulse with an amplitude of $V_a$ and a duration of $t_d$ applied on the input electrode of a synstor at the moment $t=t_n$ charges the capacitor between the CNT network and Al reference electrode, $C_{CNT/Al}$, and induces a change of the current through the CNT network toward the grounded output electrode of the synstor, $\Delta I(t) \approx w\, V_p[1-e^{-\beta_p(t-t_n)}]$, where w denotes the DC conductance of the synstor, and $\beta_p$ denotes a parameter related to $C_{CNT/Al}$ and the resistance to charge the CNT network. After the pulse ends at $t=t_o+t_d$, the capacitor is gradually discharged with a current flowing mainly toward the output electrode, $I(t) \approx I(t_n+t_d)e^{-\beta_d(t-t_n-t_d)}$, where $\beta_d$ denotes a parameter related to $C_{CNT/Al}$ and the resistance to discharge the CNT network. A series of voltage pulses trigger a current from the synstor, $I(t)=\kappa(*)(wV_i)$, where $\kappa(*)(wV_i)$ represents the temporal convolution between $\kappa(t)$ and $wV_i(t)$, $V_i(t)=\Sigma_n V_a\delta(t-t_n)$, and the kernel function, $$\kappa(t) = \begin{cases} 1 - e^{-\beta_p t} & \text{when } t \leq t_d \\ (1 - e^{-\beta_p t_d})e^{-\beta_d t} & \text{when } t > t_d \end{cases} \quad (EQ.5)$$

In some exemplary embodiments, the currents triggered by periodic voltage pulses with an amplitude $V_a=-1.75$ V, a period of 30 ns, and different durations (8-20 ns) were measured versus time (as discussed below in relation to FIGS. 8A and 8B). The currents were fitted by EQs. 1 and EQ. 5 with $\beta_p=0.67$ MHz when $t_d=10$ ns; $\beta_p=0.47$ MHz when $t_d=15$ ns. When the pulse duration increased, $\beta_p$ decreased. The CNT resistor connected with the input electrode to charge the capacitor has a much larger Schottky barrier and resistance than the CNT resistor connected with the output electrode to discharge the capacitor, leading to longer charging than discharging times, thus $\beta_p \ll \beta_d$. $\beta_p$ and $\beta_d$ could be modified by adjusting the resistance and capacitance values in accordance with embodiments.

Exemplary Physical Models and Testing Results of Learning and Memory in Synstor Embodiments In various exemplary embodiments, as shown in the simulated electronic band structures in FIG. 9C (or FIG. 9D), a pair of negative (or positive) $V_i$ and $V_o$ voltage signals on the input and output electrodes of a CNT synstor with $V_i=V_o=-1.75$ V (or $V_i=V_o=1.75$ V) increases (or decreases) the Fermi energy of the CNT network, and induces a difference of +1.66 eV (or −1.59 eV) between the CNT and $TiO_2$ Fermi energies (FIG. 10A), which injects electrons into (or depletes electrons from) the TiO$_2$ charge-storage layer by electronic hopping through the HfO$_2$ dielectric barrier layer. The changes of the charge density in the TiO$_2$ layer, $\Delta\rho_s$, induced by the paired V$_i$ and V$_o$ voltages with V$_i$=V$_o$ were measured by capacitance-voltage tests on a CNT synstor, and plotted as a function of V$_i$ and V$_o$ in FIG. 10B. When the synstor experienced V$_i$ and V$_o$ voltages with V$_i$=V$_o$≥0.92 V and V$_i$=V$_o$<−0.85 V, $\Delta\rho_s$ increased versus V$_i$, V$_o$. When the synstor experienced V$_i$ and V$_o$ voltages with 0.92 V≥V$_i$=V$_o$≥−0.85 V, the external voltage signals did not drive a significant amount of electrons to overcome the potential barrier in the HfO$_2$ layer, therefore, no significant charge modification in the charge storage layer was observed ($\Delta\rho_s$≈0) (FIG. 10B). When the synstor experienced V$_i$ and V$_o$ voltages with V$_i$=V$_o$≥0.92 V and V$_i$=V$_o$≤−0.85 V, the negative (or positive) charges in the storage layer attract (repel) the holes in the p-type semiconducting CNT network (FIG. 11A), and increase (or decrease) the device conductance w exponentially versus the magnitudes of V$_i$ and V$_o$ voltages. When a series of paired V$_i$ and V$_o$ pulses with V$_i$=V$_o$ were applied, p$_s$ was also modified by the external potential as a function of the number of the applied voltage pulses, n. p$_s$ also gradually builds up an internal potential against the external potential, resulting in $\Delta w(n)/w_0$ to change as a logarithm function of n (FIG. 11B). The Fermi energies of the p-type CNT, Al, and TiO$_2$ materials are approximately equal (with differences less than 0.2 eV), resulting in the symmetric Fermi energy differences, and similar charge and conductance modification rates by the positive and negative voltages with the equal magnitude. When a series of paired V$_i$ and V$_o$ voltage pulses with the same amplitudes (i.e. V$_i$=V$_o$) were applied on the CNT synstor simultaneously, w was modified by following the learning algorithm $\dot{w}=\alpha$ V$_i$·V$_o$(EQ. 2).

In various exemplary embodiments, as shown in the simulated electronic band structures in FIGS. 9E to 9G, when V$_i$ and V$_o$ voltages with V$_i$·V$_o$≤0 were applied on a CNT synstor, its electronic band structures were also simulated under the conditions of (1) V$_i$=−1.75 V and V$_o$=1.75 V (FIG. 9E), (2) V$_i$=−1.75 V and V$_o$=0 (FIG. 9F), (3) V$_i$=1.75 V and V$_o$=0 (FIG. 9G), and (4) V$_i$=0 and V$_o$=0 (FIG. 9B). Under these V$_i$ and V$_o$ voltages, the positive V$_i$ or V$_o$ voltage mainly drops across the reverse-biased Schottky contact between the Al electrode and p-type CNTs, and the negative V$_i$ or V$_o$ voltage mainly drops across the hole-depletion region on the lateral space beyond the TiO$_2$ charge storage layer/Al reference electrode, which leads to small differences (≤0.23 eV) between the Fermi energies of the CNT network and the recessed TiO$_2$ layer (FIG. 10A). The changes of the charge density in the TiO$_2$ layer, $\Delta\rho_s$, induced by the V$_i$ and V$_o$ voltages under −2 V≤V$_i$≤2 V and V$_o$=0 were measured by capacitance-voltage tests on a CNT synstor, and plotted as a function of V$_i$ and V$_o$ in FIG. 10B. When the synstor experienced V$_i$ and V$_o$ voltages with V$_i$≠0 and V$_o$=0, the observed charge density changes, |$\Delta\rho_s$|<25 nF/cm$^2$, which are less than 15% of the charge density changes induced by the paired pulses with the same magnitude (FIG. 10B). The conductance of the CNT synstors were tested under V$_i$·V$_o$≤0 by applying 50 pairs of various 5 ms-wide V$_i$ and V$_o$ pulses under the conditions: (1) −2 V<V$_i$<2 V and V$_o$=0; (2) −2 V<V$_o$<2 V and V$_i$=0; and (3) −2 V<V$_i$=−V$_o$<2 V. It was observed that w remained unchanged under these conditions (FIG. 11A), which indicates that the synstor has a nonvolatile memory of w (i.e. $\dot{w}$≈0 (EQ. 2) under V$_i$·V$_o$<0. When a series of 10 ns-wide V$_i$ and V$_o$ pulses with V$_i$=0 or V$_o$=0 were applied on the CNT synstor, the average percentage changes of the conductances, $|\overline{\Delta w/w_0}|$≤3.3% (FIG. 11B). The experimental tests indicated that when the CNT synstor experienced V$_i$ and V$_o$ pulses under the condition V$_i$·V$_o$<0, the V$_i$ or V$_o$ potential was below the threshold values to modify the charge stored in the TiO$_2$ layer, thus $\dot{w}$=0 (EQ. 2) for learning and nonvolatile memory.

In various exemplary embodiments, V$_i$ and V$_o$ voltages with an amplitude V$_i$=V$_o$ applied on the input and output electrodes of a synstor induce a voltage, V$_{CNT/TiO2}$, on the capacitor between the CNT network and TiO$_2$ charge-storage layer, which in turn modify the charge density, $\rho_s$, in the charge storage layer by electronic hopping through the HfO$_2$ layer (as discussed below in relation to FIGS. 9A-9G and FIGS. 10A-10B). In such embodiments, the $\rho_s$ modification rate is equal to the current density of electronic hopping through the HfO$_2$ layer, $$d\rho_s/dt = \mathcal{J}\exp\left[\frac{q(\theta\sqrt{|V_{CNT/TiO2}|} - \phi_B)}{k_B T}\right],$$

where q denotes the charge of an electron, k$_B$ denotes the Boltzmann constant, T denotes temperature, $\phi_B$ denotes the potential barrier for electrons to diffuse in the HfO$_2$ barrier layer, $\theta$ denotes a parameter related to the thickness of the HfO$_2$ layer, and $\mathcal{J}$ represents a parameter equal to current density under |V$_{CNT/TiO2}$|=($\phi_B/\theta$)$^2$. I$^n$ exemplary CNT synstors, CNT/HfO$_2$/TiO$_2$/HfO$_2$/Al layers in the synstor are composed of two capacitors connected in series with the CNT/HfO$_2$/TiO$_2$ and TiO$_2$/HfO$_2$/Al sandwich structures and corresponding capacitance c$_{CNT/TiO2}$ and c$_{TiO2/Al}$, and V$_{CNT/TiO2}$=V$_i$/v−$\rho_s$/(vc$_{TiO2/Al}$) with v=(C$_{CNT/TiO2}$+c$_{TiO2/Al}$)/c$_{TiO2/Al}$. After substituting V$_{CNT/TiO2}$ in d$\rho_s$/dt, $$d\rho_s/dt = \mathcal{J}\exp\left[\frac{q\theta\left(\sqrt{V_i - \rho_s/c_{TiO2/Al}} - \sqrt{V_t^+ - \rho_s^0/c_{TiO2/Al}}\right)}{\sqrt{v}k_B T}\right]$$

under V$_i$=V$_o$> V$_t^+$>0;

$$d\rho_s/dt = \mathcal{J}\exp\left[\frac{q\theta\left(\sqrt{-V_i + \rho_s/c_{TiO2/Al}} - \sqrt{|V_t^- - \rho_s^0/c_{TiO2/Al}|}\right)}{\sqrt{v}k_B T}\right]$$

under V$_i$=V$_o$<V$_a^{t-}$<0, where V$_t^+$=v($\phi_B/\theta$)$^2$+$\rho_s^0$/c$_{TiO2/Al}$>0, V$_t^-$=−v($\phi_B/\theta$)$^2$+$\rho_s^0$/C$_{TiO2/Al}$<0, and $\rho_s^0$ as $\rho_s$ before the voltage V$_a$ is applied. When V$_t^-$<V$_i$=V$_o$<V$_t^+$, the external voltage V$_i$ drives an insignificant amount of electrons to overcome the potential barrier in the HfO$_2$ layer, and |d$\rho_s$/dt|<| $\mathcal{J}$ |≈0. When V$_i$=V$_o$> V$_t^+$ or <V$_t^-$, the external voltage drives electrons through the potential barrier to modify $\rho_s$, and $\rho_s$ also gradually builds up an internal potential against the external potential. When $\rho_s$ is modified to balance the external potential with V$_i$−$\rho_s$/c$_{TiO2/Al}$≈V$_t^+$−$\rho_s^0$/c$_{TiO2/Al}$ or V$_i$−$\rho_s$/C$_{TiO2/Al}$≈V$_t^-$−$\rho_s^0$/c$_{TiO2/Al}$, d$\rho_s$/dt= $\mathcal{J}$ ≈0 and $\rho_s$ reaches its saturation values with $\rho_s$≈$\rho_s^0$+C$_{TiO2/Al}$[V$_i$−V$_t^+$] or $\rho_s$≈$\rho_s^0$+C$_{TiO2/Al}$[V$_i$−V$_t^-$]. In the capacitance-voltage test, after a synstor experiences multiple voltage pulses with V$_i$=V$_o$ on its input and output electrodes, the modification of the charge densities in the synstor, $$\Delta \rho_s \approx \begin{cases} c_{TiO2/Al}[V_i - V_t^+] & \text{when } V_i = V_o > V_t^+ > 0 \\ 0 & \text{when } V_a^{t-} < V_i = V_o < V_t^+ \\ c_{TiO2/Al}[V_i - V_t^-] & \text{when } V_i = V_o < V_t^- < 0 \end{cases} \quad \text{(EQ. 6)}$$

where $\Delta\rho_s = \rho_s - \rho_s^0$. The experimental observed $\Delta\rho_s$ data (FIG. 10B) are fitted well by EQ. 6 with $\Delta\rho_s = k_\rho^+[V_a - V_t^+]$ under $V_i = V_o > V_t^+ > 0$ and $\Delta\rho_s = k_\rho^-[V_a - V_t^-]$ under $V = V_o < V_t^- < 0$ with $k_\rho^+ = -145$ nF/cm², $k_\rho^- = -106$ nF/cm², $V_t^+ = 0.92$V, and $V_t^- = -0.85$ V.

Multiple $V_i$ and $V_o$ voltage pulses with an amplitude $V_i = V_o = V_a$ applied on the input and output electrodes of an exemplary synstor also can modify $\rho_s$, and the change of $\rho_s$, $\Delta\rho_s$ induces the change of the Fermi level of the CNT network, which in turn causes the change of device conductance (as discussed in reference to FIG. 11A, below), $$w \approx w_0 \exp\left(\frac{q\Delta V_{CNT}^f}{k_B T}\right), \text{ and } \Delta w = w - w_0 = w_0\left[\exp\left(\frac{q\Delta V_{CNT}^f}{k_B T}\right) - 1\right],$$

where $w_0$ denotes the initial device DC conductance before the charge modification, and $q\Delta V_{CNT}^f$ denotes the change of the CNT Fermi level induced by $\Delta\rho_s$. $\Delta V_{CNT}^f$ increases monotonically with $-\Delta\rho_s$ in the p-type CNTs, and its linear approximation gives $\Delta V_{CNT}^f \approx -\varepsilon_\rho^+ \Delta\rho_s$ when $\Delta\rho_s > 0$ and $\Delta V_{CNT}^f \approx -\varepsilon_\rho^- \Delta\rho_s$ when $\Delta\rho_s < 0$, where $\varepsilon_\rho^+$ and $\varepsilon_\rho^-$ denote constants related to the device structure, capacitance, CNT doping concentration. After substituting $\Delta V_{CNT}^f$ in $\Delta w$ by $\Delta\rho_s$ in EQ. 6, $$\frac{\Delta w}{w_0} \approx \begin{cases} e^{-\beta_v^+(V_i - V_t^+)} - 1 & \text{when } V_i = V_o \geq V_t^+ > 0 \\ 0 & \text{when } V_a^{t-} < V_i = V_o < V_t^+ \\ e^{-\beta_v^-(V_i - V_t^-)} - 1 & \text{when } V_i = V_o \leq V_t^- < 0 \end{cases} \quad \text{(EQ. 7)}$$

where $\beta_v^+ = q\varepsilon_\rho^+ c_{TiO2/Al}/k_B T$ and $\beta_v^- = q\varepsilon_\rho^- c_{TiO2/Al}/k_B T$. The experimental data, $\Delta w/w_0$, (FIG. 11A) were fitted by EQ. 7, $\Delta w/w_0 = e^{\beta_v^+(V_i - V_t^+)} - 1$ with $\beta_v^+ = 4.06$/V and $V_t^+ = 1.05$ V under $V_i = V_o > V_t^+$; and $\Delta w/w_0 = e^{-\beta_v^-(V_i - V_t^-)} - 1$ with $\beta_v^- = 3.69$/V and $V_t^- = -0.81$ V under $V_i = V_o < V_t^-$; $\Delta w \approx 0$ under $V_t^+ > V_i = V_o > V_t^-$.

When a series of $V_i$ and $V_o$ voltage pulses with $V_i = V_o$ are applied, $\rho_s$ is modified by the pulses as a function of the number of the applied pulses, n (as discussed below in relation to FIG. 11B, below). The modification rate, $$\frac{d\rho_s}{dn} = t_d \frac{d\rho_s}{dt} = \mathcal{J} t_d \exp\left[\frac{q\left(\theta\sqrt{|V_i - \rho_s/c_{TiO2/Al}|} - \sqrt{v}\phi_B\right)}{\sqrt{v}k_B T}\right]$$

with $t_d$ as the pulse duration. The solution of the differential equation gives $$\rho_s(n) \approx \eta^+ \text{Ln}\left(\frac{n}{n_0^+} + 1\right) + \rho_s^0$$

with $$\eta^+ = 2\sqrt{v}kTc_{TiO2/Al}\sqrt{V_i - \rho_s^0/c_{TiO2/Al}}/(q\theta), \text{ and}$$

$$n_0^+ = \eta^+ \exp\left[\frac{q\phi_B}{k_B T}\right]/(\mathcal{J} t_d) \text{ under } V_a \geq V_t^+ > 0.$$

$$\rho_s(n) \approx -\eta^- \text{Ln}\left(\frac{n}{n_0^-} + 1\right) + \rho_s^0 \text{ with}$$

$$\eta^- = 2\sqrt{v}kTc_{TiO2/Al}\sqrt{-V_i + \rho_s^0/c_{TiO2/Al}}/(q\theta) \text{ and}$$

$$n_0^- = \eta^- \exp\left[\frac{q\phi_B}{k_B T}\right]/(\mathcal{J} t_d) \text{ under } V_a \leq V_t^- < 0.$$

$$\Delta\rho_s(n) = \rho_s(n) - \rho_s^0$$

induces the shift of the CNT Fermi energy $q\Delta V_{CNT}^f(n)$, which in turn induces $$\Delta w(n) = w_0\left[\exp\left(\frac{q\Delta V_{CNT}^f(n)}{k_B T}\right) - 1\right] \approx \frac{w_0 q \Delta V_{CNT}^f(n)}{k_B T} =$$

$$\frac{w_0 q \varepsilon_\rho^\pm}{k_B T} \Delta\rho_s(n) = \frac{w_0 \eta^\pm q \varepsilon_\rho^\pm}{k_B T} \text{Ln}\left(\frac{n}{n_0^\pm} + 1\right).$$

Therefore, $$\frac{\Delta w(n)}{w_0} \approx \begin{cases} \kappa^+ \text{Ln}\left(\frac{n}{n_0^+} + 1\right) & \text{when } V_i = V_o \geq V_t^+ > 0 \\ 0 & \text{when } V_a^{t-} < V_i = V_o < V_t^+ \\ \kappa^- \text{Ln}\left(\frac{n}{n_0^-} + 1\right) & \text{when } V_i = V_o \leq V_t^- < 0 \end{cases} \quad \text{(EQ. 8)}$$

where $$\kappa^+ = \frac{q\eta^+ \varepsilon_\rho^+}{k_B T} \text{ and } \kappa^- = \frac{q\eta^- \varepsilon_\rho^-}{k_B T}.$$

The experimental data, $\Delta w(n)/w_0$, (FIG. 11B) were fitted well by EQ. 8, $$\Delta w(n)/w_0 = k_n^+ \text{Ln}\left(\frac{n}{n_0^+} + 1\right) \text{ with}$$

$k_n^+ = 7.5$ and $n_0^+ = 1.7 \times 10^3$ for $V_i = V_o = 1.75$ V; and by $$\Delta w(n)/w_0 = k_n^- \text{Ln}\left(\frac{n}{n_0^-} + 1\right) \text{ with } k_n^- = 15.3 \text{ and}$$

$n_0^- = 1.76 \times 10^5$ for $V_i = V_o = -1.75$ V.

Synstors were modified to its high and low conductance values, $w_H$ and $w_L$, by applying 50 pairs of 5 ms-wide $V_i$ and $V_o$ pulses with $V_i = V_o = -1.75$ V and $V_i = V_o = 1.75$ V alternatively in 2930 modification cycles, and no deterioration of device conductance modification was observed (FIG. 11C).

108 synstors on a chip were modified to $w_H$ and $w_L$ respectively, and the distributions of $w_H$ and $w_L$ values are shown in FIG. 11D. The average $w_H$ value, $\overline{w}_H 1.9$ nS, and the standard deviation of $w_H$, $\sigma_H = 0.44$ nS. $w_L < 0.2$ nS, which is the limit of the measurement module.

After synstors were modified to different analog conductances, $w_0$, the nonvolatile memory of the synstors was examined by measuring their conductances versus time over $1.75 \times 10^5$ s at room temperature. Within the test period, the average percentage changes of the conductances $|\Delta w/w_0| \approx 3\%$, and the extrapolations of the experimental data indicate their long-term (~10 years) nonvolatile analog memory (FIG. 11E).

Simulations of Nanoscale Synstors

Figure 12A:
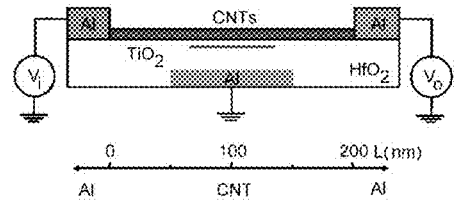

Nanoscale synstors have been simulated by Technology Computer-Aided Design (TCAD) simulator (Sentaurus Device, Synopsys). The cross-sectional structure of a simulated synstor composed of a 200 nm-wide p-type semiconducting CNT network channel formed contacts with an Al input and an Al output electrodes is shown in FIG. 12A. The CNT network is on a 2.5 nm-thick $HfO_2$ dielectric layer on a 1.0 nm-thick $TiO_2$ charge storage layer on a 4.5 nm-thick $HfO_2$ dielectric layer on an Al reference electrode. There is a 50 nm lateral space between the Al reference electrode/$TiO_2$ charge storage layer and the Al input and output electrodes, and the $TiO_2$ charge storage layer is also laterally recessed with respect to the Al reference electrode by 20 nm at both ends. The simulated electronic band diagrams along the Al input electrode/CNT/Al output electrode under various $V_i$, the voltage on the input electrode, and $V_o$, the voltage on the output electrode are shown in FIGS. 12B to 12F.

Figure 12G:
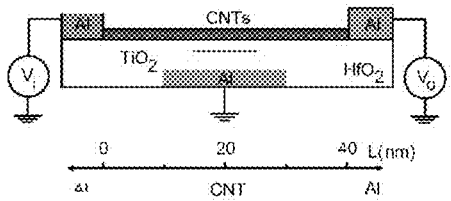
Figure 12B:
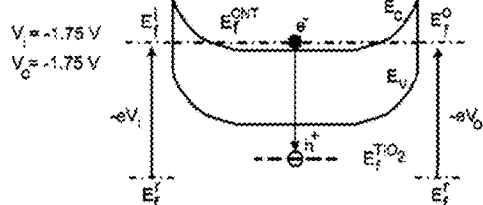

When a pair of negative $V_i$ and $V_o$ pulses with $V_i=V_o=-1.75$ V are applied on the input and output electrodes of the 200 nm CNT synstor simultaneously, the negative voltage on the CNT network with respect to the Al reference electrode inverts the p-type CNTs above the Al reference electrode to n-type CNTs, and moves the edge of the CNT conduction band close to the Fermi level of the Al input/output electrodes (FIG. 12B). The capacitance between a single CNT in the network and the continuous $TiO_2$ charge-storage layer is much smaller than the capacitance between the $TiO_2$ layer and the Al reference electrode. Therefore, the negative voltage between the CNT network with respect to the Al reference electrode predominantly drops across the CNT network and the $TiO_2$ charge-storage layer, which induces an average difference of 1.51 eV between the CNT and $TiO_2$ Fermi energies (FIG. 13A), and drives electrons from the CNT network into the $TiO_2$ charge-storage layer through the 2.5 nm-thick $HfO_2$ dielectric layer to increase the negative charge in the $TiO_2$ layer. Based on the TCAD simulation, the negative $V_i$ and $V_o$ voltages with $V_i=V_o=-1.75$ V modify the charge in the $TiO_2$ layer to a density of $-6.86$ $\mu C/cm^2$ (FIG. 13B), which attracts holes in the CNT network, increasing the device conductance, w. When a pair of positive $V_i$ and $V_o$ pulses with $V_i=V_o=1.75$ V are applied on the input and output electrodes of the 200 nm CNT synstor simultaneously, the positive voltage on the CNT network with respect to the Al reference electrode induces hole accumulation in the p-type CNTs above the Al reference electrode FIG. 12C). The positive voltage between the CNT network with respect to the Al reference electrode predominantly drops across the CNT network and the $TiO_2$ charge storage layer, which induces a difference of $-1.51$ eV between the CNT and $TiO_2$ Fermi energies (FIG. 13A), and drives electrons from the $TiO_2$ charge storage layer to the CNT network through the 2.5 nm-thick $HfO_2$ dielectric layer (FIG. 12C). Based on the TCAD simulation, the positive $V_i$ and $V_o$ voltages with $V_i=V_o=1.75$ V modify the charge in the $TiO_2$ layer to a density of 5.14 $\mu C/cm^2$ (FIG. 13B), which attracts holes in the CNT network, increasing the device conductance, w.

Electronic band diagrams were also simulated by TCAD when a pair of $V_i$ and $V_o$ pulses are applied on the input and output electrodes of the synstor with the 200 nm-wide CNT network under the different conditions: (1) $V_i=-1.75$ V and $V_o=1.75$ V (FIG. 12D); (2) $V_i=1.75$ V and $V_o=-1.75$ V (not shown, but symmetric to FIG. 12D); (3) $V_i=1.75$ V and $V_o=0$ (FIG. 12E); (4) $V_i=0$ V and $V_o=1.75$ V (not shown, but symmetric to FIG. 12E); (5) $V_i=-1.75$ V and $V_o=0$ (FIG. 12F); (6) $V_i=0$ V and $V_o=-1.75$ V (not shown, but symmetric to FIG. 12F). Under the $V_i \cdot V_o \leq 0$ conditions, the $V_i$ and/or $V_o$ voltages mainly drops across the hole-depletion region on the lateral space beyond the $TiO_2$ charge storage layer (FIGS. 12D-12F), which leads to small Fermi energy differences (c 0.15 eV) between the CNTs and the recessed $TiO_2$ layer across the $HfO_2$ dielectric layer (FIG. 13A). Based on the TCAD simulation, the small Fermi energy differences cannot drive electrons to tunnel through the 2.5 nm-thick $HfO_2$ dielectric layer (FIG. 13B). Thus, the charge stored in the $TiO_2$ layer cannot be modified by $V_i$ and $V_o$ pulses with $V_i \cdot V_o < 0$, and the synstor conductance, w, remains unchanged. Based on the TCAD simulation, when the synstor is scaled down to 200 nm, it still functions properly for signal processing, learning, and memory.

The cross-sectional structure of a simulated synstor composed of a 40 nm-wide p-type semiconducting CNT network channel formed contacts with an Al input and an Al output electrode is shown in FIG. 12G. The CNT network is on a 1.5 nm-thick $HfO_2$ dielectric layer on a 0.5 nm-thick $TiO_2$ charge storage layer on a 2.5 nm-thick $HfO_2$ dielectric layer on an Al reference electrode. There is a 10 nm lateral space between the Al reference electrode and the Al input and output electrodes, and the $TiO_2$ charge storage layer is also laterally recessed with respect to the Al reference electrode by 2.5 nm at both ends (FIG. 12G).

Figure 12H:
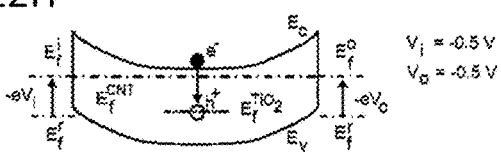
Figure 12C:
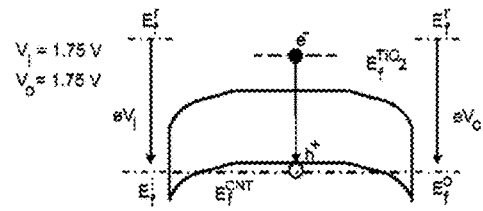
Figure 12I:
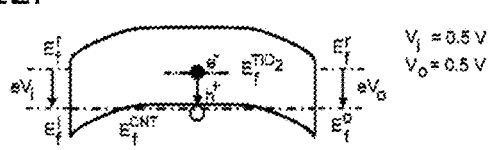
Figure 12D:
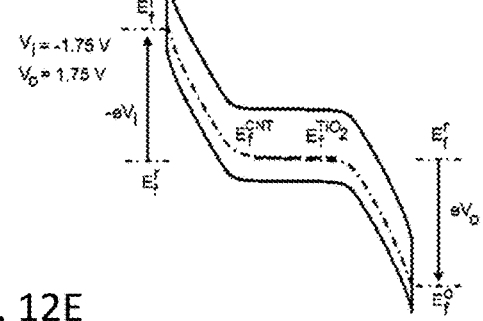

The simulated electronic band diagrams along the Al input electrode/CNT/Al output electrode under various $V_i$, the voltage on the input electrode, and $V_o$, the voltage on the output electrode of the 40 nm CNT synstor are shown in FIG. 12H-I. In the synstor learning mode, when a pair of negative $V_i$ and $V_o$ pulses with $V_i=V_o=-0.5$ V are applied on the input and output electrodes of a synstor simultaneously, the negative voltage on the CNT network with respect to the Al reference electrode inverts the p-type CNTs above the Al reference electrode to n-type CNTs, and moves the edge of the CNT conduction band close to the Fermi level of the Al input/output electrodes (FIG. 12H). The negative voltage between the CNT network with respect to the Al reference electrode predominantly drops across the CNT network and the $TiO_2$ charge-storage layer, which induces a difference of 0.43 eV between the CNT and $TiO_2$ Fermi energies (FIG. 13C), and drives electrons from the CNT network into the $TiO_2$ charge-storage layer through the 1.5 nm-thick $HfO_2$ layer (FIG. 13D). Based on the TCAD simulation, the negative $V_i$ and $V_o$ voltages with $V_i=V_o=-0.5$ V modify the charge in the $TiO_2$ layer to a density of $-3.06$ $\mu C/cm^2$ (FIG. 13D), which attracts the holes in the CNT network above the $TiO_2$ layer, increasing the device conductance, w. When a pair of positive $V_i$ and $V_o$ pulses with $V_i=V_o=0.5$ V are applied on the input and output electrodes of a synstor simultaneously, the positive voltage on the CNT network with respect to the Al reference electrode induce hole accumulation in the p-type CNTs above the Al reference electrode (FIG. 12I). The positive voltage between the CNT network with respect to the Al reference electrode predominantly drops across the CNT network and the $TiO_2$ charge storage layer, which induces a difference of $-0.43$ eV between the CNT and $TiO_2$ Fermi energies (FIG. 13C), and drives electrons from the $TiO_2$ charge storage layer to the CNT network through the 1.5 nm-thick $HfO_2$ dielectric layer (FIG. 12I). Based on the TCAD simulation, the positive $V_i$ and $V_o$ voltages with $V_i=V_o=0.5$ V modify the charge in the $TiO_2$ layer to a density of 2.93 $\mu C/cm^2$ (FIG. 13D), which repels the holes in the CNT network above the TiO$_2$ layer, decreasing the device conductance, w.

Figure 12J:
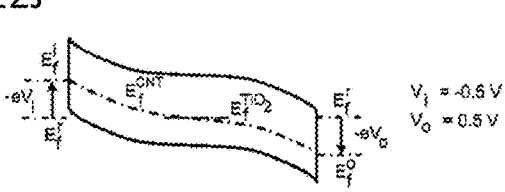
Figure 12E:
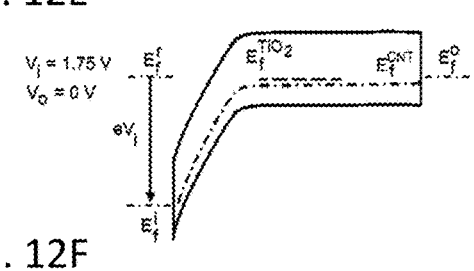
Figure 12K:
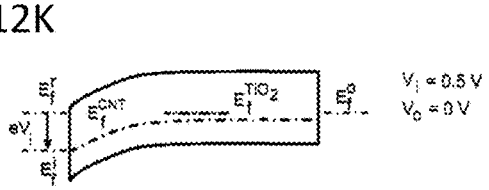
Figure 12F:
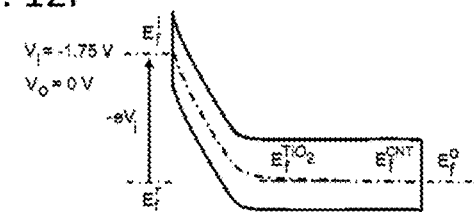
Figure 12L:
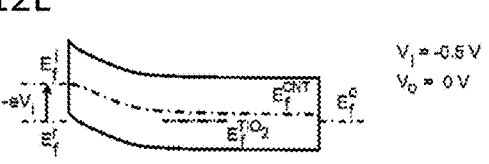

Electronic band diagrams were also simulated by TCAD when a pair of V$_i$ and V$_o$ pulses are applied on the input and output electrodes of the 40-nm synstor under different conditions: (1) V$_i$=−0.5 V and V$_o$=0.5 V (FIG. 12J); (2) V$_i$=0.5 V and V$_o$=−0.5 V (not shown, but symmetric to FIG. 12J); (3) V$_i$=0.5 V and V$_o$=0 (FIG. 12K); (4) V$_i$=0 V and V$_o$=0.5 V (not shown, but symmetric to FIG. 12K); (5) V$_i$=−0.5 V and V$_o$=0 (FIG. 12I); (6) V$_i$=0 V and V$_o$=−0.5 V (not shown, but symmetric to FIG. 12I). Under the V$_i$·V$_o$≤0 conditions, the V$_i$ and/or V$_o$ voltages mainly drops across the hole-depletion region on the lateral space beyond the TiO$_2$ charge storage layer (FIG. 12J-L), which leads to small Fermi energy differences (≤0.11 eV) between the CNTs and the recessed TiO$_2$ layer across the HfO$_2$ dielectric layer (FIG. 13C). The small Fermi energy differences cannot drive electrons to tunnel through the 1.5 nm-thick HfO$_2$ dielectric layer, causing ignorable changes of the charges in the TiO$_2$ layer (FIG. 13D). Since the charge stored in the TiO$_2$ layer cannot be modified by V$_i$ and V$_o$ pulses with V$_i$·V$_o$<0, the synstor conductance, w, remains unchanged. Based on the TCAD simulation, when the synstor is scaled down to 40 nm, it still functions properly for concurrent signal processing, learning, and memory.

I$^n$ summary, in this exemplary embodiment, the CNT synstor is composed of a p-type semiconducting CNT network which formed Schottky contacts with Al input and output electrodes as a resistor, and a recessed TiO$_2$ charge storage layer embedded in a HfO$_2$ dielectric layer sandwiched between an Al reference electrode and the CNT network as a capacitor. For signal processing, a synstor processes a set of voltage pulses, V$_i$(t), on its input electrode by charging the capacitor during the pulses, and discharging the capacitor after the pulses, and triggering a current via the CNT resistor, I(t)=κ(✻)(wV$_t$) (EQ. 1) on its grounded output electrode (V$_o$=0). When a set of paired V$_i$ and V$_o$ voltage pulses with the same amplitude (i.e. V$_i$=V$_o$) are applied on the CNT synstor simultaneously, w is modified by following $\dot{w}=\alpha V_i V_o$ (EQ. 2). The paired negative (positive) voltage pulses generate a potential difference between the CNT network and TiO$_2$ layer to increase (decrease) the electronic charge stored in the TiO$_2$ layer, which in turn attracts (repels) the holes in the p-type semiconducting CNT network to increase (decrease) its conductance with α>0 (α<0). Otherwise, when a synstor experiences V$_i$ and V$_o$ pulses under the condition V$_i$·V$_o$≤0, the V$_i$ or V$_o$ potential mainly drops beyond the TiO$_2$ charge storage layer/Al reference electrode, and the magnitudes of the potential differences between the CNT network and the recessed TiO$_2$ layer are below the threshold values to modify the charge stored in the TiO$_2$ layer, thus $\dot{w}$=0 (EQ. 2) for learning and nonvolatile memory. Based on simulation of nanoscale devices, microscale synstors in this exemplary embodiment can potentially be miniaturized to nanoscale (~40 nm).

Exemplary Synstor Circuits

The concurrent signal processing and learning of synstors according to embodiments were demonstrated in an exemplary 4×2 crossbar circuit, as shown schematically in FIG. 14A, composed of 72 synstors and 2 integrate-and-fire "neuron" circuits with the functions according to the Hodgkin-Huxley neuron model. In this exemplary embodiment, nine synstors were connected in parallel with an input, an output, and a reference electrode with serpentine structures at each cross point of the electrodes to reduce noises from the devices (FIG. 14B).

Original speech signals consisted of unlabeled "yes" and "no" utterances were pre-processed to generate the set of voltage pulses, V$_i^m$(t), input to the crossbar synstor circuit (FIG. 14A). The input pulses had an amplitude of 1.75 V or −1.75 V, a duration of 10 ns, and firing rates, r$_i^m$, proportional to mel frequency cepstral coefficients (MFCCs) of the speech signals at the different frequency ranges (FIG. 14C). The synstor circuit processed the −1.75 V V$_i^m$(t) pulses and triggered currents by following I$^n$(t) $\Sigma_m$ κ$^{nm}$(✻)(w$^{nm}$V$^m$) (EQ. 3) under V$_o^n$=0, which flowed into the integrate-and-fire "neuron" circuits to trigger 10 ns-wide±1.75 V back-propagating voltage pulses, V$_o^n$(t), on the output electrodes (FIG. 14D), and forwarding-propagating 1.0 V output pulses, V$_f^n$(t) (FIG. 14E). The firing rates of the V$_f^n$ pulses, r$_f^n$, increased monotonically as a nonlinear sigmoid function of I$^n$. When a V$_f^n$ pulse was triggered from the n$^{th}$ "neuron" as a "winner" (i.e. r$_f^n$>r$_f^{n'}$, n≠n'), a series of 10 ns-wide −1.75 V V$_o$ pulses was triggered on the n$^{th}$ output electrode of the "winner", and then a series of 10 ns-wide 1.75 V V$_o$ pulses was triggered on the n$'^{th}$ output electrode of the "loser" (FIGS. 14D and 14E). To reduce the currents in the circuit, no voltage pulses with opposite polarity were applied on the input and output electrodes simultaneously. In the parallel unsupervised learning process, when the sets of V$_i^m$ and V$_o^n$ voltage pulses encountered each other in the synstors (FIG. 14F), the conductance matrix [W$^{nm}$]$^{N,M}$ was modified by following EQ. 4 and a "winner-take-all" learning algorithm, $\dot{w}^{nm}\alpha V_i^m V_o^n \propto (r_f^n - r_f^{n'})r_i^m$, resulting in the change of $$r_f^n, \delta r_f^n \propto \begin{cases} (\bar{r}_{f,Y}^n - \bar{r}_{f,Y}^{n'}) & \text{for "yes"} \\ (\bar{r}_{f,N}^n - \bar{r}_{f,N}^{n'}) & \text{for "no"} \end{cases},$$

with $\bar{r}_{f,Y}^n$ and $\bar{r}_{f,N}^n$ as the average firing rates of the V$_f^n$ pulses triggered by "yes" word and "no" words, respectively. Before learning started (i.e. V$_o$=0 when t<16 s), the "yes" and "no" words triggered V$_f$ pulses from the two "neurons", which were not orthogonal or distinguishable (FIG. 14E). After the learning started (t>16 s), the "yes" words triggered V$_f$ pulses with $\bar{r}_{f,Y}^2 > \bar{r}_{f,Y}^1$, thus "neuron" 2 was the "winner" with $\delta r_{f,Y}^2 \propto (\bar{r}_{f,Y}^2 - \bar{r}_{f,Y}^1)>0$, and r$_{f,Y}^2$ increased and stabilized at $\hat{r}_{f,Y}^2$≈16 Hz; $\delta r_{f,Y}^1 \propto (\bar{r}_{f,Y}^1 - \bar{r}_{f,Y}^2)<0$, and r$_{f,Y}^1$ decreased to $\hat{r}_{f,Y}^1$=0. The "no" words triggered the V$_f$ pulses with $\bar{r}_{f,N}^1 > \bar{r}_{f,N}^2$, thus the "neuron" 1 was the "winner" with $\delta r_{f,N}^1 \propto (\bar{r}_{f,N}^1 - \bar{r}_{f,N}^2)>0$ and r$_{f,N}^1$ increased and stabilized at $\hat{r}_{f,N}^1$≈14 Hz; $\delta r_{f,N}^2 \propto (\bar{r}_{f,N}^2 - \bar{r}_{f,N}^1)<0$, and r$_{f,N}^2$ decreased to $\hat{r}_{f,N}^2$=0 (FIG. 14E). After the circuit processed and learnt from 2-3 unlabeled speech signals, the "yes" and "no" speech signals were stably mapped to two distinguishable orthogonal sets of output pulses with average firing rates $$\vec{\hat{r}}_{f,Y} \approx \begin{bmatrix} 0 \\ 16 \end{bmatrix} \text{Hz and } \vec{\hat{r}}_{f,N} \approx \begin{bmatrix} 14 \\ 0 \end{bmatrix} \text{Hz.}$$

The 4×2 crossbar synstor circuit in this exemplary embodiment was demonstrated for concurrent signal processing and learning from "yes" and "no" speech signals. The speech signals were converted to a set of input voltage pulses, $\vec{V}_i$, processed by the synstor circuit in parallel to generate output currents (EQ. 3), which in turn triggered sets of forward-propagating output voltage pulses, $\vec{V}_f$, from the connected integrate-and-fire "neuron" circuits for signal processing, and back-propagating voltage pulses, $\vec{V}_o$, on the output electrodes of the synstor circuit. During the signal processing, the conductance matrix $[w^{nm}]^{N,M}$ of the synstor circuit was concurrently modified by following the correlative learning algorithm (EQ. 4) in a parallel learning process, leading to the orthogonal sets of output $\vec{V}_f$ voltage pulses to distinguish "yes" and "no" speech signals. As demonstrated in this exemplary embodiment, a synstor circuit can execute spatiotemporal signal processing (EQ. 3) and correlative learning (EQ. 4) algorithms concurrently with high energy efficiency by circumventing the fundamental computing limitations in existing electronic circuits such as physically separated logic and memory units, data transmission between memory and logic, the execution of the signal processing and learning algorithms in serial mode in different circuits, and the signal transmissions between the circuits.

In comparison with computers, the equivalent computing operations in a M×N synstor circuit shown in FIG. 5 are approximately equal to 3MN to implement the signal processing algorithm (EQ. 3), and 3MN to implement the learning algorithm (EQ. 4). The speed for the circuit to implement 6MN signal processing and learning operations in parallel analog mode, $$v_s = 6MNf_s \quad \text{(EQ. 9)}$$

where $f_s$ denotes the circuit operation frequency. With $f_s=50$ MHz, the 4×2 synstor circuit in this exemplary embodiment operated at a speed of $2.4 \times 10^9$ FLOPS (FIG. 15).

The total power consumption of an M×N synstor circuit shown in FIG. 5, $$P_s \approx MN\overline{w}V_a^2 D_p + NE_p \overline{r}_f \quad \text{(EQ. 10)}$$

where $\overline{w}$ denotes the average conductance of the synstors in the circuit, $V_a$ denotes the voltage pulse magnitude, $D_p$ is a unitless coefficient related to the input and output voltage signals, $E_p$ denotes the average energy consumption to switch the transistors in a "neuron" circuit to trigger an output voltage pulse and modulate back-propagating $V_o$ pulses, and $\overline{r}_f$ denotes the average firing rate of the output $\vec{V}_f$ pulses from the "neuron" circuit. Based on the experimental results and circuit simulation, $P_s \approx 15$ nW for the 4×2 crossbar synstor circuit in this exemplary embodiment with $\overline{w} \approx 1.9$ nS, $V_a = 1.75$ V, $D_p \approx 0.32$, and $E_p \approx 28$ fJ.

The energy efficiency of an M×N synstor circuit shown in FIG. 5 is equal to its speed (EQ. 9) divided by its power consumption (EQ. 10), $$F_s = 6f_s/(\overline{w}V_a^2 D_p + E_p \overline{r}_f/M) \quad \text{(EQ. 11)}$$

As shown in FIG. 15, the equivalent computing energy efficiency of the 4×2 synstor circuit in this exemplary embodiment is $1.6 \times 10^{17}$ FLOPS/W, which exceeds the energy efficiencies of digital transistor circuits such as Summit Supercomputer, TPU from Google, and Volta V100 GPU from Nvidia (~$10^{13}$ FLOPS), and the memristor circuit from UMass/HP and PCM circuits from IBM (~$10^9$-$10^{11}$ FLOPS/W), and of the analog neuromorphic circuits of memristors and PCM (~$10^5$-$10^{14}$ FLOPS/W, excluding learning algorithm computations). The energy consumption of a synstor circuit decreases with decreasing synstor conductance v (EQ. 11); therefore the energy efficiency of the synstor circuit can be further improved by decreasing synstor conductance (FIG. 15).

In digital serial mode, transistors operate at high conductance (~$10^5$ nS) in order to reduce computing latency (~$10^{-9}$ s) and enhance accuracy; in analog parallel mode, synstors (synapses) operate at low conductance (c 2 nS), and the computing latency and accuracy of an M×N synstor (synapse) circuit increase with increasing M and N, the numbers of parallel input/output electrodes (see, e.g., FIGS. 16A and 16B). The phase shifts of the pulses and the sneak currents in an M×N crossbar synstor circuit increase with increasing circuit scale, M and N, which limits M,N≤$10^4$ for concurrent signal processing and learning in parallel, and can be improved by decreasing the conductance of synstors, and the resistance and capacitance of input/output electrodes.

The speed of an M×N crossbar synstor circuit (FIG. 5) increases with increasing circuit scale, M and N (EQ. 9). With the energy efficiency equal to the 4×2 circuit in this exemplary embodiment, a 2 k×2 k circuit with a power consumption of ~10 mW (EQ. 10) has a projected speed of ~$10^{15}$ FLOPS (FIG. 17), exceeding the speeds of digital transistor circuits such as TPU from Google, Volta V100 GPU from Nvidia, and Stratrix 10 FPGA from Intel (~$10^{13}$ FLOPS), and the memristor circuit from UMass/HP, and PCM circuits from IBM (~$10^{12}$-$10^{14}$ FLOPS).

The microscale synstor circuit in this exemplary embodiment has a computing performance density of ~$1.3 \times 10^{11}$ FLOPS/mm², which is superior to that of nanoscale transistor circuits (~$10^9$-$10^{11}$ FLOPS/mm²) such as TPU from Google, Volta V100 GPU from Nvidia, and Stratrix 10 FPGA from Intel, and inferior to that of nanoscale memristor and PCM circuits (~$10^9$-$10^{12}$ FLOPS/mm²). Based on simulation of nanoscale devices, synstors can potentially be miniaturized to nanoscale (~40 nm) with a projected performance density of ~$10^{17}$ FLOPS/mm².

There is "plenty of room at the bottom" to miniaturize synstor size, scale up synstor circuits, improve their energy efficiency, speed, power consumption, and uniformity for concurrent signal processing and learning from "big data" in intelligent systems.

DOCTRINE OF EQUIVALENTS

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to +2%, less than or equal to +1%, less than or equal to +0.5%, less than or equal to ±0.1%, or less than or equal to ±0.05%. For example, "substantially" aligned can refer to a range of angular variation of less than or equal to ±10°, such as less than or equal to 5°, less than or equal to ±4°, less than or equal to ±3°, less than or equal to 2°, less than or equal to ±1°, less than or equal to ±0.5°, less than or equal to 0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

What is claimed is:

1. A synstor, capable of providing analog signal processing, memory and learning functions of synapse, comprising:
   an input electrode and an output electrode;
   a semiconducting channel connected between the input and output electrodes;
   at least one dielectric layer disposed adjacent to the semiconducting channel, the dielectric layer disposed adjacent to at least one side of the channel;
   a reference electrode disposed adjacent to the dielectric layer; and
   a charge storage material disposed within a portion of the dielectric layer;
   wherein at least a portion of the dielectric layer is disposed between the charge storage material and the semiconducting channel such that a voltage difference between the channel and the charge storage material must have a magnitude above a threshold value to drive charge through the at least one dielectric layer to the charge storage material to alter a net charge within the charge storage material in an analog mode;
   wherein a combination of the input and output electrodes and the semiconducting channel between form at least one resistor, and the combination of the semiconducting channel, the dielectric layer, the charge storage material, and the reference electrode form at least one capacitor;
   wherein the synstor is configured to apply a zero or a constant voltage to the reference electrode, and when no voltage signals are applied on the input and output electrodes, a standby zero voltage or a standby constant voltage is applied on the input and output electrodes; and
   wherein the synstor is further configured such that at least one set of voltage signals may be applied on the input and output electrodes with respect to the standby voltage such that:
      when a set of input voltage signals is applied on the input electrode and wherein no voltage signal is applied on the output electrode, the set of input voltage signals induce an output current on the output electrode through the at least one resistor and charges the at least one capacitor such that, after the set of input voltage signals end, the charge in the at least one capacitor is discharged and induces an output current on the output electrode, and wherein the output current may last after the set of input voltage signals ends,
      when a set of voltage signals is applied on the input electrode and wherein a set of voltage signals with a same or similar amplitude as the set of the input voltage signals is applied to the output electrode simultaneously, the magnitude of the voltage difference between the channel and the charge storage material produced thereby is above the threshold value, charge is driven through the portion of the dielectric layer disposed between the channel and the charge storage material to modify the net charge within the charge storage material and a conductance of the synstor in an analog mode for learning,
      when a set of voltage signals is applied to one of either the input or the output electrode and wherein no voltage signal or a set of voltage signals with an opposite polarity is applied to the other of either the input or output electrode simultaneously, or when no voltage signals is applied to either the input or the output electrode, the magnitude of the voltage difference between the channel and the charge storage material produced thereby falls below the threshold value such that charge is not driven through the portion of the dielectric layer disposed between the channel and the charge storage material such that the net charge in the charge storage material remains unchanged and the conductance of the synstor remains unchanged for learning, and
      when a set of voltage signals is applied to one of either the input or the output electrode with respect to the standby voltage and wherein no voltage signal or a set of voltage signals with the opposite polarity is applied to the other of either the input or output electrode simultaneously, or when no voltage signals is applied to either the input or the output electrode, or when no external voltages is applied to either the input or the output or the reference electrode, the conductance of the synstor remains unchanged as memory.

2. The synstor of claim 1, the voltage signals applied to the input and output electrodes can be voltage pulses with fixed amplitudes and temporal durations for signal processing and learning.

3. The synstor of claim 1, wherein the set of the input voltage signals induces a dynamic output current for signal processing, and the dynamic output current is a convolution of a kernel function and a product of the set of input voltage signals and the synstor conductance.

4. The synstor of claim 1, wherein a change rate of the conductance of the synstor is equal to a product of a conductance modification coefficient, the input voltage signal, and the output voltage signal.

5. The synstor of claim 1, wherein the input and output electrodes and the semiconducting channel form a contact with a contact resistance, which is comparable with or larger than the resistance of the channel.

6. The synstor of claim 1, wherein the semiconducting channel forms Schottky barriers with the input and output electrodes, and wherein the input and output electrodes and the channel form a contact with a contact resistance which is comparable with or larger than the resistance of the channel.

7. The synstor of claim 1, wherein the channel is dimensioned to have a length between the input and output electrodes longer than the length of the reference electrode.

8. The synstor of claim 1, wherein the reference electrode extends beyond at least one edge of the portion of the dielectric layer containing the charge storage material.

9. The synstor of claim 1, wherein a thickness of the dielectric layer between the charge storage material and the channel is less than the thickness of the dielectric layer between the charge storage material and the reference electrode.

10. The synstor of claim 1, wherein the semiconducting channel comprises a semiconducting material selected from the group consisting of carbon nanotube, Si, graphene, Ge, SiC, ZnO, InO, InP, $TiO_2$, $Cu_2O$, GaN, GaAs, $MoS_2$, $MoSe_2$, $WS_2$, $WSe_2$, GaSe, GaTe, FeTe, polymers, molecules, and combinations thereof.

11. The synstor of claim 1, wherein the semiconducting channel has a channel length between about $5-10^6$ nm, a channel width between about $5-10^6$ nm, and a channel thickness between about $0.1-10^5$ nm.

12. The synstor of claim 1, wherein the input, output and reference electrodes comprise a conducting or semiconducting material selected from the group consisting of Ti, Al, Au, Ni, Pt, Cu, carbon nanotube, Si, graphene, Ge, SiC, ZnO, InO, InP, $TiO_2$, $Cu_2O$, GaN, GaAs, $MoS_2$, $MoSe_2$, $WS_2$, $WSe_2$, GaSe, GaTe, FeTe, polymers, and combinations thereof.

13. The synstor of claim 1, wherein the dielectric layers comprises an insulative material selected from the group consisting of $HfO_2$, $Al_2O_3$, $SiO_2$, $Si_3N_4$, Si, C, Ge, SiC, ZnO, InO, InP, $TiO_2$, $Cu_2O$, GaN, GaAs, polymers, molecules, and combinations thereof.

14. The synstor of claim 1, wherein the dielectric layers have a dielectric length between about $5-10^6$ nm, a dielectric width between about $5-10^6$ nm, and a dielectric thickness between about $0.2-10^3$ nm.

15. The synstor of claim 1, wherein the charge storage material is selected from the group consisting of molecules, nanoparticles, semiconductor quantum dots, dopants, implanted ions, defects, vacancies, impurities, semiconducting materials, dielectric materials, and metals.

16. The synstor of claim 1, wherein the charge storage material is within a volume with a length between about $5-10^6$ nm, a width between about $5-10^6$ nm, and a thickness between about $0.1-10^3$ nm.

17. The synstor of claim 1, wherein:
the semiconducting channel extends laterally beyond at least one edge of the portion of the dielectric layer containing the charge storage material;
the semiconducting channel extends laterally beyond at least one edge of the reference electrode; and
the reference electrode extends laterally beyond at least one edge of the portion of the dielectric layer containing the charge storage material; and a thickness of the dielectric layer between the charge storage material and the channel is less than the thickness of the dielectric layer between the charge storage material and the reference electrode.

18. A synstor capable of providing analog signal processing, memory and learning functions of biological synapse, comprising:
a body connected with an input electrode, an output electrode, and a reference electrode;
wherein the synstor is configured to apply a zero or a constant voltage to the reference electrode, and when no sets of voltage signals are applied on the input and output electrodes, a standby zero voltage or a standby constant voltage is applied on the input and output electrodes; and
wherein the synstor is configured such that sets of voltage signals may be applied on the input and output electrodes with respect to the standby voltage such that:
when a set of input voltage signals is applied on the input electrode with respect to the standby voltage and wherein no voltage signal is applied on the output electrode, the set of the input voltage signals induces a dynamic output current on the output electrode for signal processing,
when a set of voltage signals is applied on the input electrode and wherein a set of voltage signals with at least one same or similar amplitude as the set of the input voltage signals is applied to the output electrode simultaneously, a conductance of the synstor is changed in analog mode; when a set of voltage signals is applied to one of either the input or the output electrode and wherein no voltage signal or a set of voltage signals with an opposite polarity is applied to the other of either the input or output electrode simultaneously, or when no voltage signals is applied to either the input or the output electrode, the conductance of the synstor remains unchanged for learning, and
when a set of voltage signals is applied to one of either the input or the output electrode with respect to the standby voltage and wherein no voltage signal or a set of voltage signals with the opposite polarity is applied to the other of either the input or output electrode simultaneously, or when no voltage signals is applied to either the input or the output electrode, or when no external voltages is applied to either the input or the output or the reference electrode, the conductance of the synstor remains unchanged as memory.

19. The synstor of claim 18, wherein the dynamic output current is a convolution of a kernel function and a product of the input voltage signals and the synstor conductance.

20. The synstor of claim 18, wherein a change rate of the conductance of the synstor is a product of a conductance modification coefficient, the input voltage signal, and the output voltage signal.

21. A synaptic circuit capable of providing analog signal processing, memory and learning functions comprising:
a plurality of synstors, each in turn comprising a body connected with an input electrode, an output electrode, and a reference electrode;
wherein each synstor is configured to apply a zero or a constant voltage to the reference electrode, and when no sets of voltage signals are applied on the input and output electrodes, a standby zero voltage or a standby constant voltage is applied on the input and output electrodes; and
wherein each synstor is configured such that sets of voltage signals may be applied on the input and output electrodes with respect to the standby voltage, thereof such that:
when a set of input voltage signals is applied on the input electrode with respect to the standby voltage and wherein no voltage signal is applied on the output electrode, the set of the input voltage signals induces a dynamic output current on the output electrode for signal processing,
when a set of voltage signals is applied on the input electrode and wherein a set of voltage signals with at least one same or similar amplitude as the set of the input voltage signals is applied to the output electrode simultaneously, a conductance of the synstor is changed in analog mode; when a set of voltage signals is applied to one of either the input or the output electrode and wherein no voltage signal or a set of voltage signals with an opposite polarity is applied to the other of either the input or output electrode simultaneously, or when no voltage signals is applied to either the input or the output electrode, the conductance of the synstor remains unchanged for learning, and when a set of voltage signals is applied to one of either the input or the output electrode with respect to the standby voltage and wherein no voltage signal or a set of voltage signals with the opposite polarity is applied to the other of either the input or output electrode simultaneously, or when no voltage signals is applied to either the input or the output electrode, or when no external voltages is applied to either the input or the output or the reference electrode, the conductance of the synstor remains unchanged as memory; and wherein each of the plurality of synstors is a component of a circuit comprising an M×N network of said synstors connected with M input electrodes and N output electrodes such that each input electrode is connected with multiple output electrodes by one or more synstors such that a set of voltage signals applied on the M input electrodes induces dynamic output currents via synstors flowing to the N output electrodes in analog parallel mode for signal processing, wherein the dynamic output currents on the N output electrodes define a current vector which is equal to a convolution of kernel functions and a product of a synstor conductance matrix and the vector of the input voltage signals on the M input electrodes;

wherein the circuit is configured such that when a set of voltage signals is applied on the M input electrodes and a set of voltage signals is applied on the N output electrodes, concurrently the synstor conductance matrix is modified in an analog parallel mode for learning, wherein a modification rate of the synstor conductance matrix is proportional to an outer product between the vectors of input and output voltage signals; and wherein concurrently, the circuit is configured to process the voltage signals on the input electrodes and is modified by the voltage signals on the input and output electrodes.

* * * * *